(12) United States Patent
Arisaka et al.

(10) Patent No.: US 9,520,352 B2
(45) Date of Patent: Dec. 13, 2016

(54) WIRING BOARD AND SEMICONDUCTOR DEVICE

(71) Applicant: SHINKO ELECTRIC INDUSTRIES CO., LTD., Nagano-shi, Nagano (JP)

(72) Inventors: Hiromu Arisaka, Nagano (JP); Noriyoshi Shimizu, Nagano (JP); Toshinori Koyama, Nagano (JP); Akio Rokugawa, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 14/962,536

(22) Filed: Dec. 8, 2015

(65) Prior Publication Data
US 2016/0172287 A1 Jun. 16, 2016

(30) Foreign Application Priority Data

Dec. 10, 2014 (JP) ................................. 2014-250019
Feb. 4, 2015 (JP) ................................. 2015-019885

(51) Int. Cl.
*H01L 23/498* (2006.01)
*H01L 23/31* (2006.01)
(Continued)

(52) U.S. Cl.
CPC ..... *H01L 23/49822* (2013.01); *H01L 23/3157* (2013.01); *H01L 23/49811* (2013.01);
(Continued)

(58) Field of Classification Search
CPC .................. H01L 23/49822; H01L 23/49816; H01L 23/49811; H01L 23/49827; H01L 23/49894; H01L 2924/15174; H01L 2224/16225; H01L 2924/15311; H05K 1/115; H05K 1/181; H05K 2201/2081
See application file for complete search history.

(56) References Cited

U.S. PATENT DOCUMENTS 8,212,151 B2 * 7/2012 Yamamoto ............ H01L 21/563
174/258
2010/0132998 A1 6/2010 Lee et al.

FOREIGN PATENT DOCUMENTS

JP 2010-129996 6/2010

OTHER PUBLICATIONS

Co-pending U.S. Appl. No. 14/962,527, filed Dec. 8, 2015.

* cited by examiner

*Primary Examiner* — David Vu
(74) *Attorney, Agent, or Firm* — Rankin, Hill & Clark LLP

(57) ABSTRACT

A wiring board includes a first wiring layer, a first insulating layer, first via wirings, connection terminals and a protection layer. The first insulating layer is formed with through holes. The first via wirings are formed in the through holes. The connection terminals are electrically connected to the first wiring layer through the first via wirings. The connection terminals protrude upward from the first insulating layer. The protection layer is made of insulating resin which contains photosensitive resin as a main component. The protection layer is formed on an upper surface of the first insulating layer. The protection layer includes first and second protection layers. The first protection layer surrounds the connection terminals. The second protection layer is separated from the first protection layer. The second protection layer is thinner than the first protection layer.

9 Claims, 25 Drawing Sheets

(51) Int. Cl.
*H05K 1/11* (2006.01)
*H05K 1/18* (2006.01)
*H01L 23/544* (2006.01)

(52) U.S. Cl.
CPC .. *H01L 23/49816* (2013.01); *H01L 23/49827* (2013.01); *H01L 23/49894* (2013.01); *H01L 23/544* (2013.01); *H05K 1/11* (2013.01); *H05K 1/115* (2013.01); *H05K 1/181* (2013.01); *H01L 2224/16225* (2013.01); *H01L 2924/0002* (2013.01); *H01L 2924/15174* (2013.01); *H01L 2924/15311* (2013.01); *H05K 2201/2081* (2013.01)

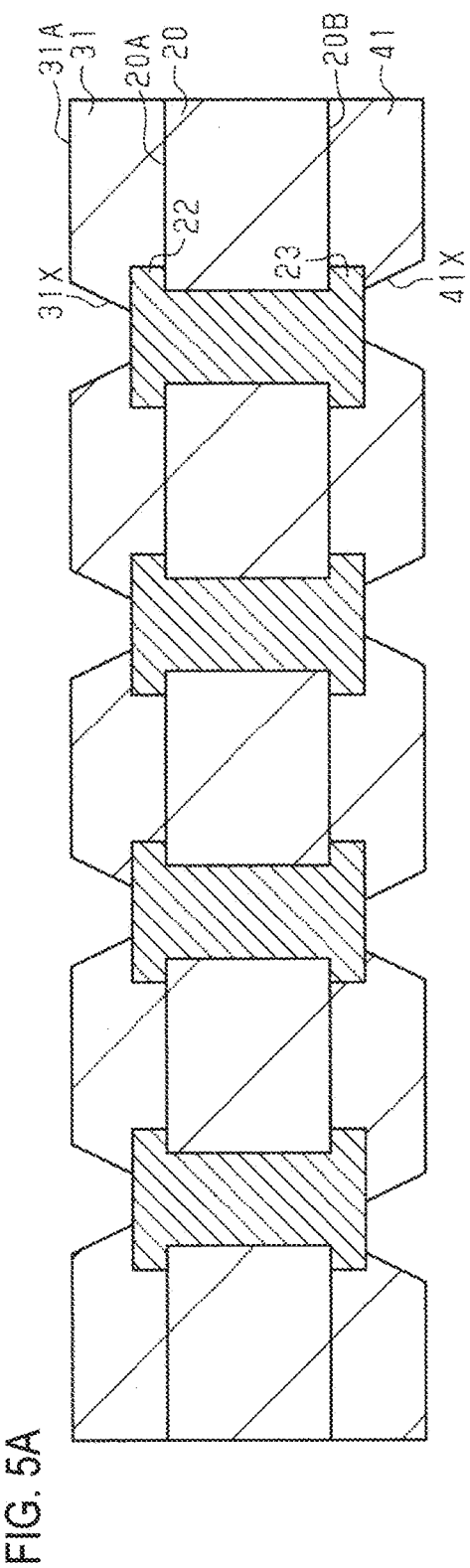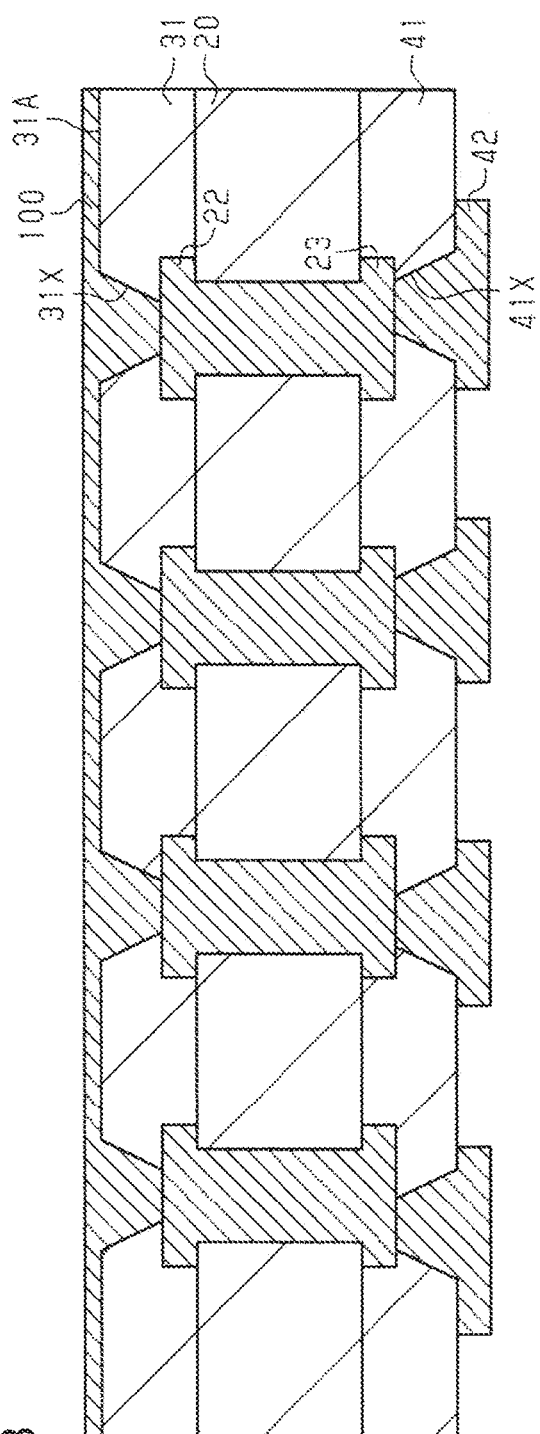
FIG. 5A
FIG. 5B

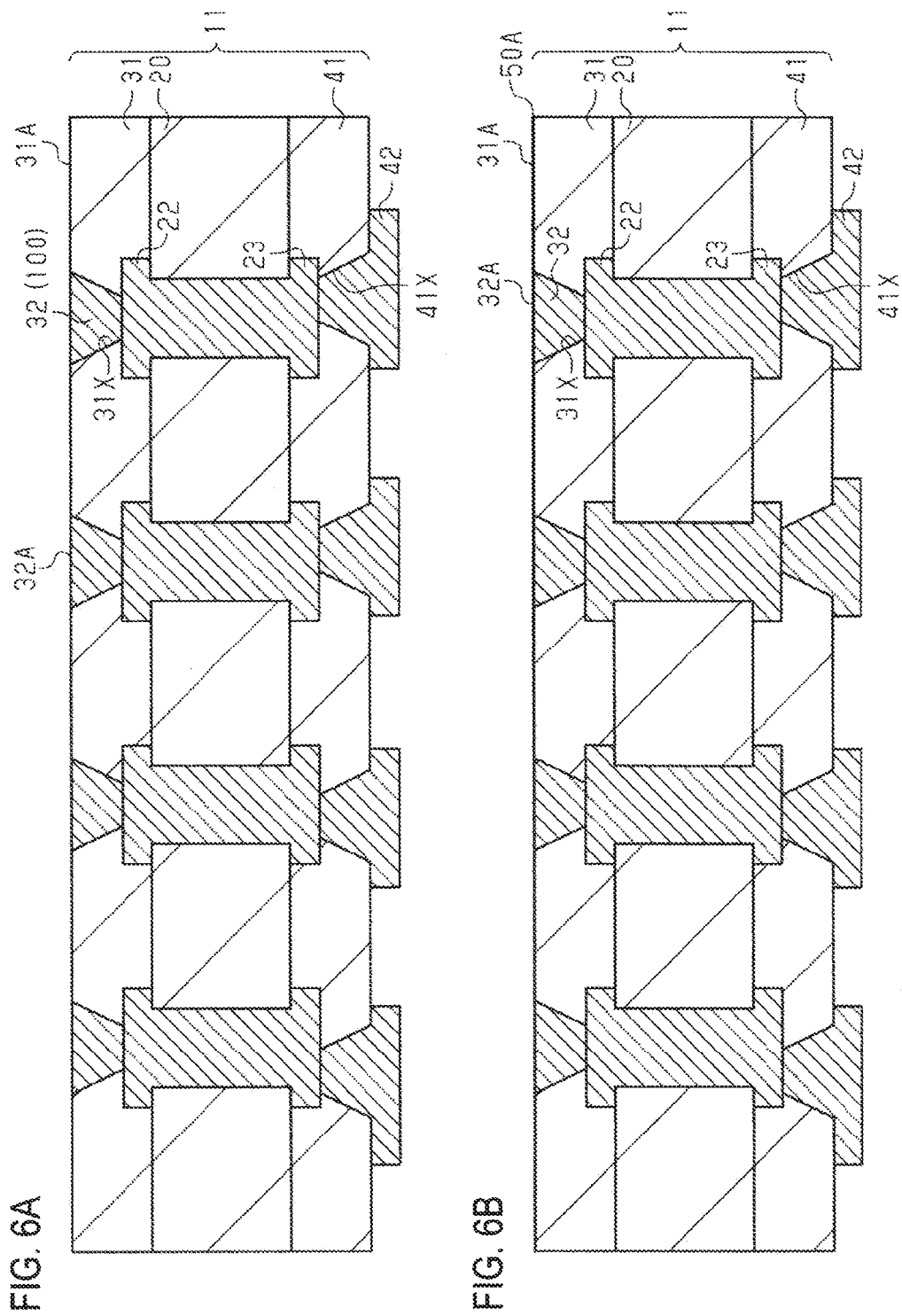

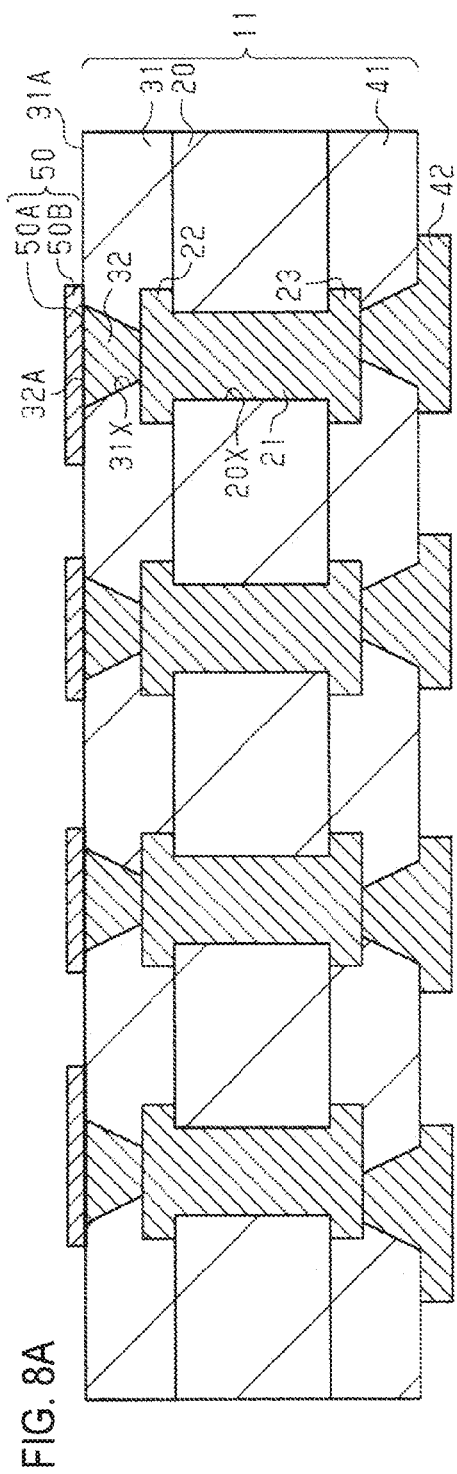
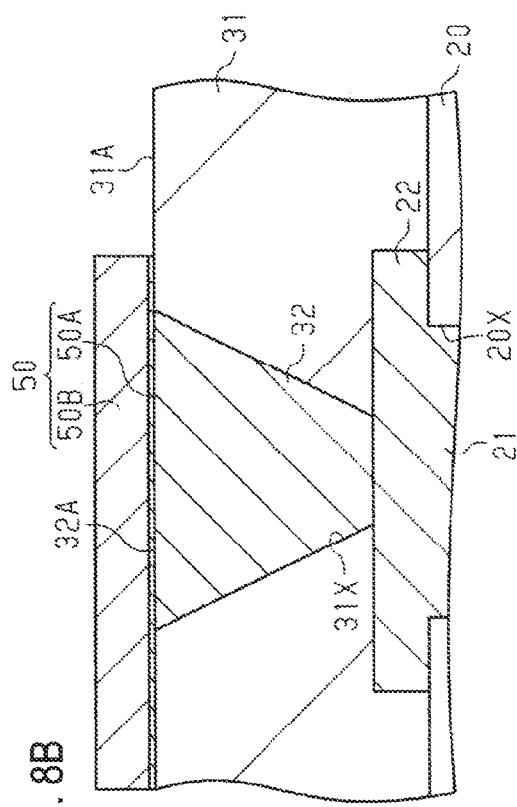
FIG. 8A
FIG. 8B

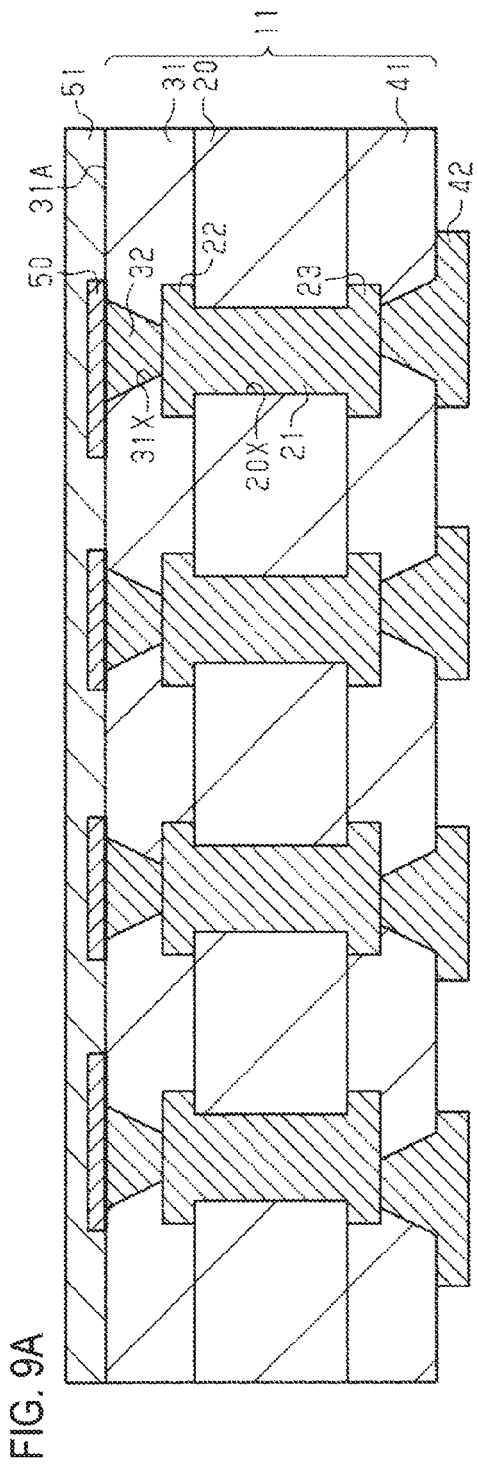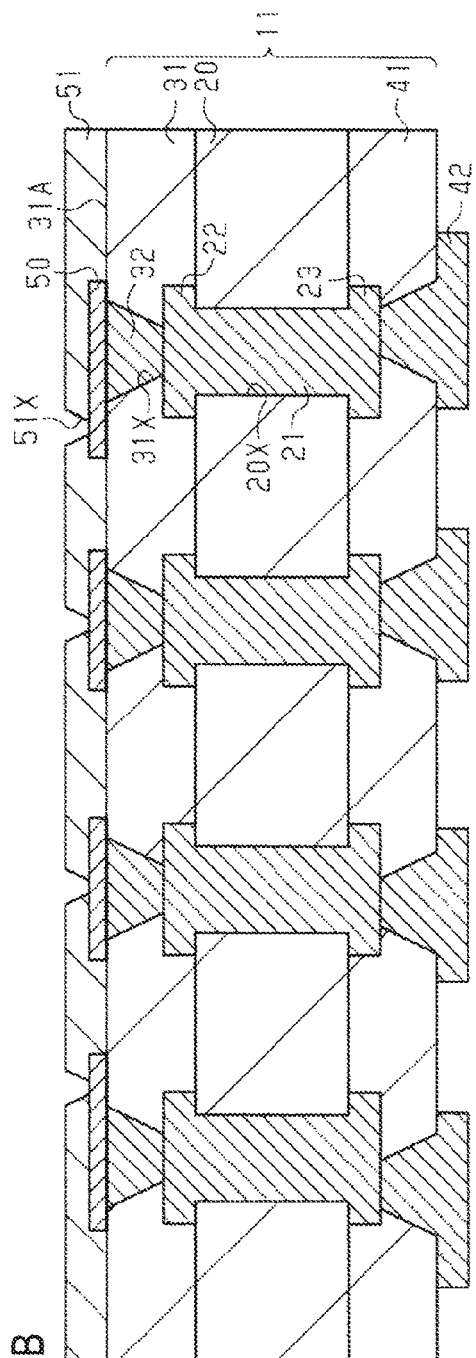

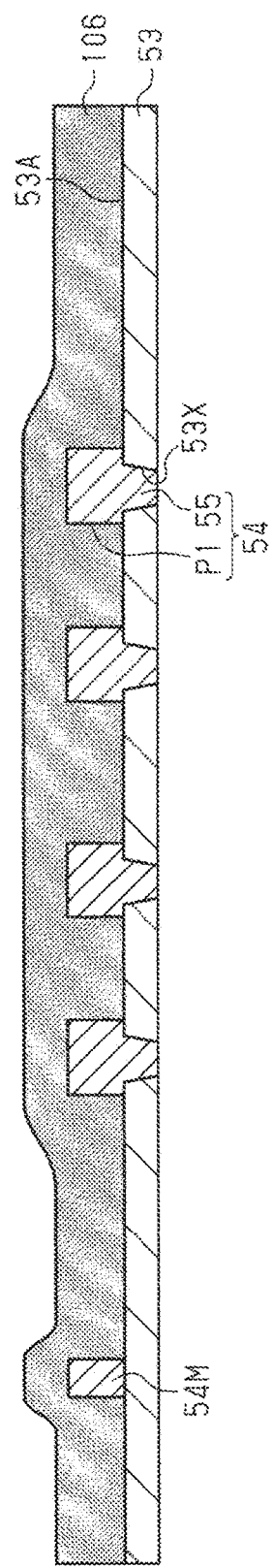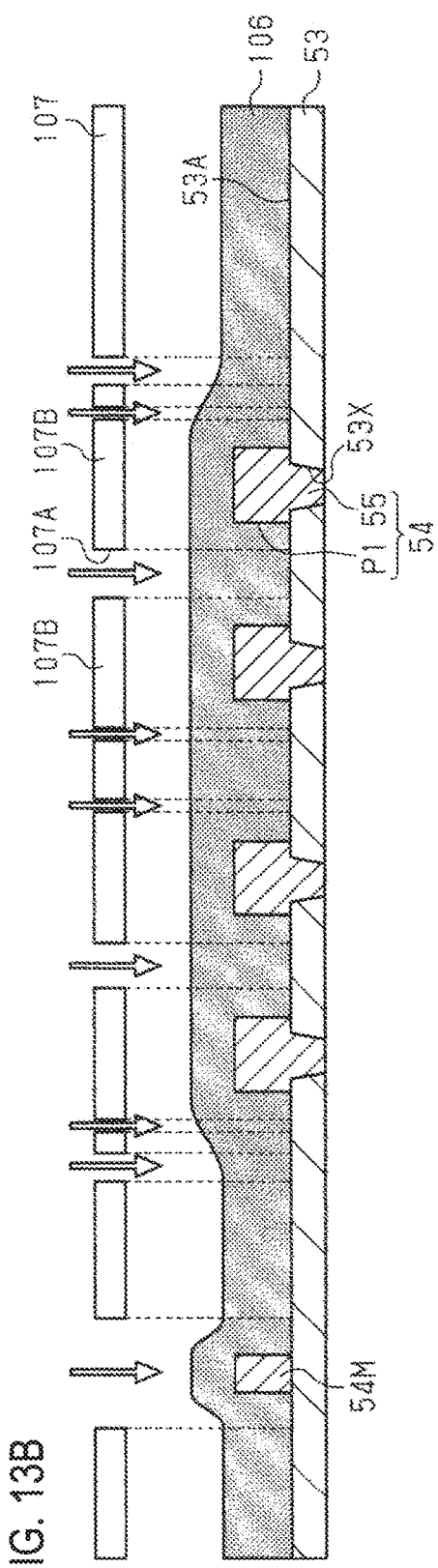

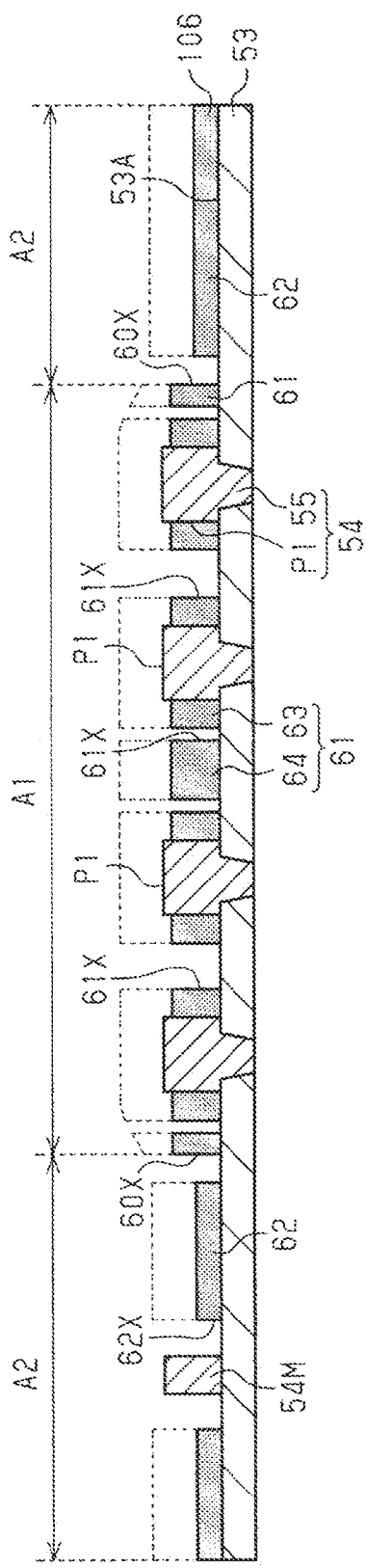
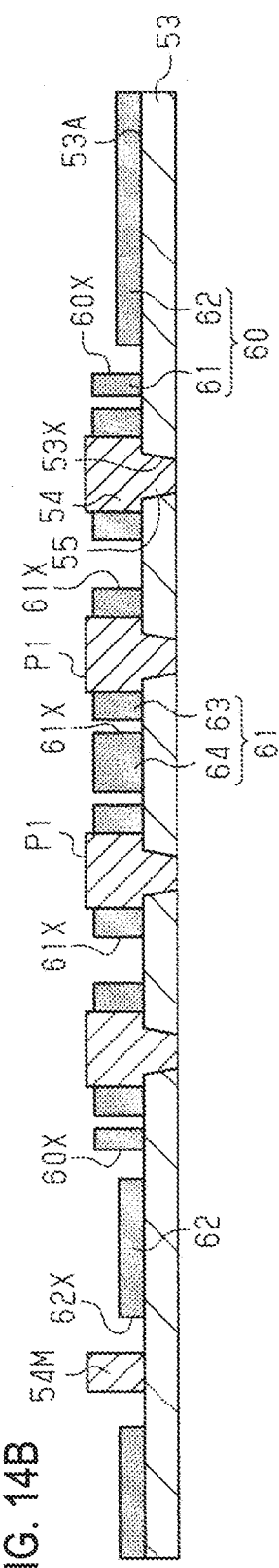
FIG. 14A
FIG. 14B

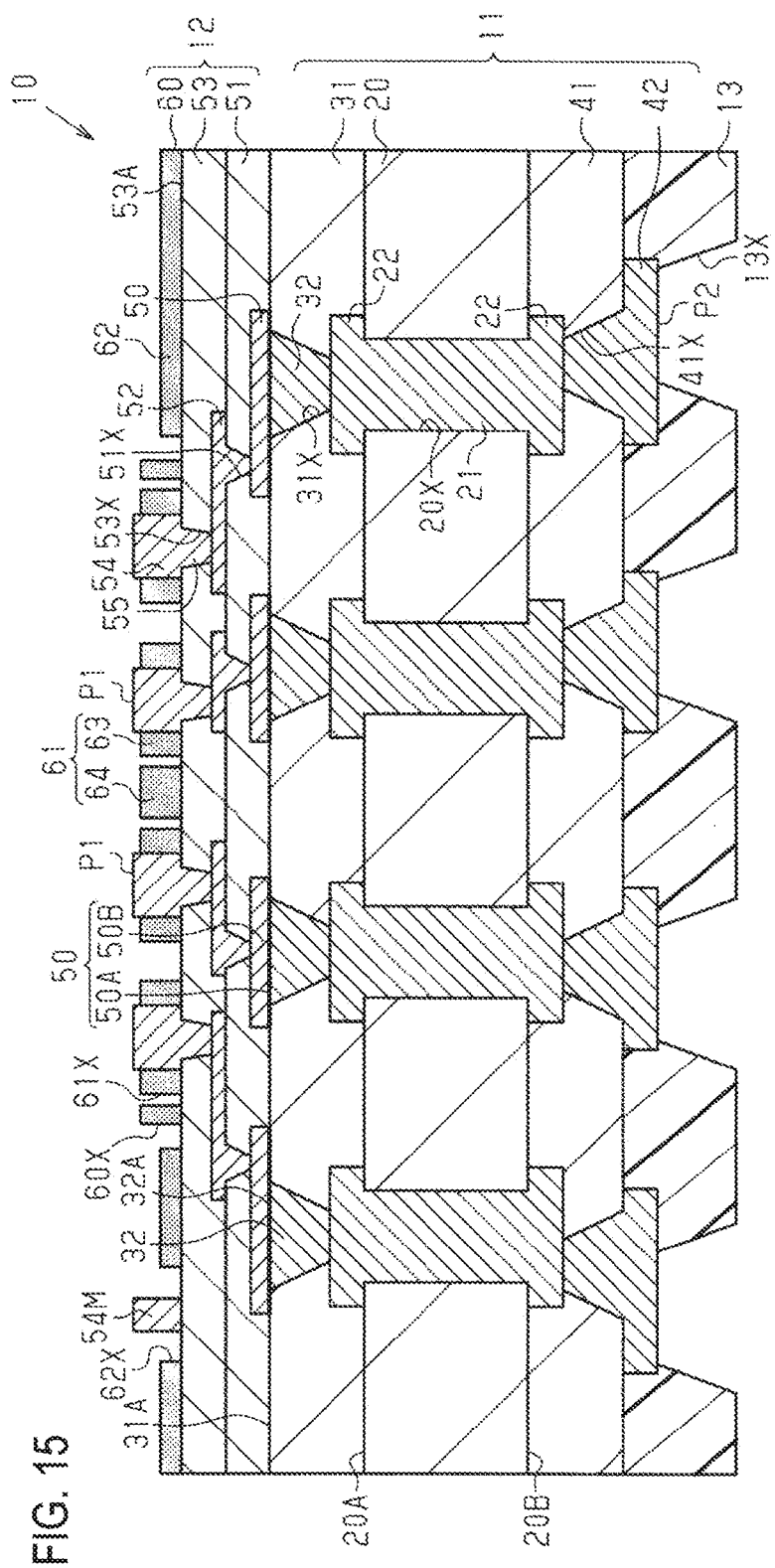

Example

Comparative Example

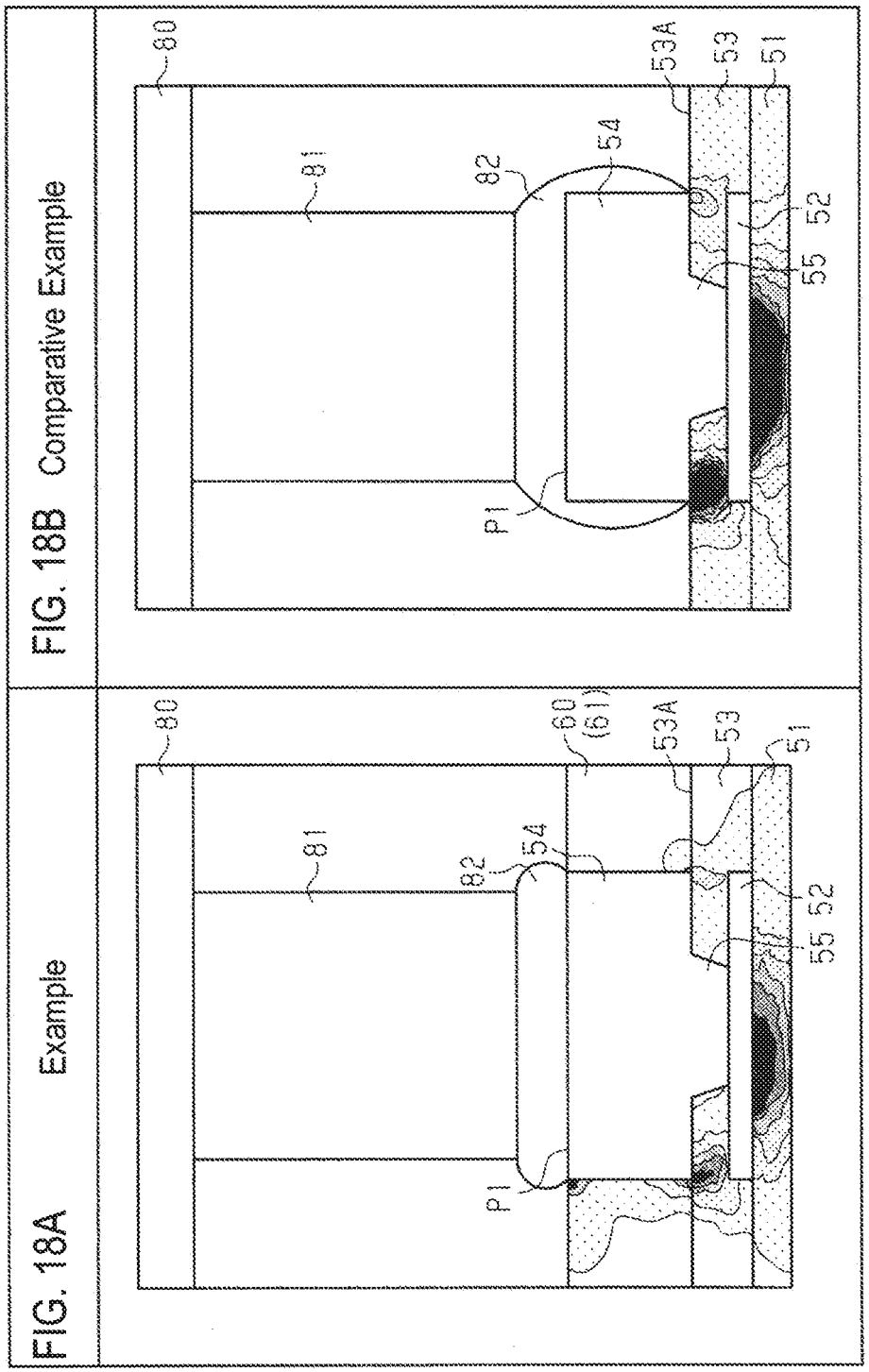

| | Warpage direction | Amount of warpage |
|---|---|---|
| Example | | 36.94 μm |
| Comparative Example | | 37.28 μm |

WIRING BOARD AND SEMICONDUCTOR DEVICE

CROSS-REFERENCE TO RELATED APPLICATION(S)

This application claims priority from Japanese Patent Application No. 2014-250019 (filed on Dec. 10, 2014) and 2015-019885 (filed on Feb. 4, 2015), the entire contents of which are herein incorporated by reference.

BACKGROUND

Technical Field

Exemplary embodiments of the invention relate to a wiring board, a semiconductor device, and a method for manufacturing the wiring board.

Related Art

Wiring boards having various shapes and structures have been proposed as wiring boards to be mounted with electronic components such as semiconductor chips. In recent years, with higher integration and higher function of semiconductor chips, demands for finer wirings in wiring boards to be mounted with the semiconductor chips have increased. To this end, there has been proposed a wiring board in which a solder resist layer is formed on a. base substrate where a wiring pattern has been formed, and columnar connection terminals are formed on the wiring pattern exposed from the solder resist layer (for example, see JP 2010-129996 A (corresponding to US 2010/0132998 A1)).

SUMMARY

When photosensitive resin is used as a material of the solder resist layer, cracks and so on may be easily generated in an interface between the solder resist layer and each connection terminal. In particular, the solder resist layer made of photosensitive resin is mechanically weak because the solder resist layer contains no reinforcing material such as glass cloth. In addition, there is a difference in thermal expansion coefficient between the solder resist layer and the connection terminal (for example, a copper layer). Therefore, in a region where the connection terminal is formed, thermal stress concentrates at the interface between the connection terminal and the solder resist layer, and cracks and so on are easily generated in the interface.

According to one exemplary embodiment, a wiring board includes a first wiring layer, a first insulating layer, first via wirings, connection terminals and a protection layer. The first wiring layer includes an upper surface, a lower surface that is opposite from the upper surface, and a side surface that connects the upper surface and the lower surface. The first insulating layer is made of first insulating resin which contains first photosensitive resin as a main component. The first insulating layer covers the side surface of the first wiring layer and covers one part of the upper surface of the first wiring layer. The first insulating layer is formed with through holes. The through holes passes through the first insulating layers in a thickness direction. The through holes expose the remaining part of the first wiring layer. The first via wirings are formed in the through holes. The connection terminals are electrically connected to the first wiring layer through the first via wirings. The connection terminals protrude upward from an upper surface of the first insulating layer. The connection terminals are to be connected to an electronic component. The protection layer is made of second insulating resin which contains second photosensitive resin as a main component. The protection layer is formed on the upper surface of the first insulating layer. The protection layer includes a first protection layer and a second protection layer. The first protection layer is formed in a mounting region in which the electronic component is to be mounted. The first protection layer surrounds the connection terminals. The second protection layer is formed in an outer peripheral region outside the mounting region. The second protection layer is separated from the first protection layer by a first opening portion which exposes the upper surface of the first insulating layer. The second protection layer is thinner than the first protection layer.

With this configuration, an advantageous effect can be achieved that it is possible to suppress generation of cracks and so on in an interface between each connection terminal and the insulating layer.

BRIEF DESCRIPTION OF THE DRAWINGS

FIGS. 5A and 5B are schematic sectional views showing the method for manufacturing the wiring board according to the first exemplary embodiment;

FIGS. 6A and 6B are schematic sectional views showing the method for manufacturing the wiring board according to the first exemplary embodiment;

FIG. 8A is a schematic sectional view showing the method for manufacturing the wiring board according to the first exemplary embodiment;

FIG. 8B is an enlarged sectional view in which a part of FIG. 8A is enlarged;

FIGS. 9A and 9B are schematic sectional views showing the method for manufacturing the wiring board according to the first exemplary embodiment;

FIGS. 13A and 13B are enlarged sectional views showing the method for manufacturing the wiring board according to the first exemplary embodiment;

FIGS. 14A and 14B are enlarged sectional views showing the method for manufacturing the wiring board according to the first exemplary embodiment;

FIG. 15 is a schematic sectional view showing the method for manufacturing the wiring board according to the first exemplary embodiment;

FIG. 18A is an explanatory view showing a simulation result of a stress distribution in the example;

FIG. 18B is an explanatory view showing a simulation result of a stress distribution in the comparative example;

DETAILED DESCRIPTION

Exemplary embodiment will be described in detail below with reference to the accompanying drawings.

In some accompanying drawings, a constituent element(s) may be enlarged in order to make it easy to understand the constituent element(s). A dimension ratio of each constituent element is not always identical to an actual dimension ratio thereof. Also, in sectional views, a part of members may be shown without hatching but with a satin pattern or hatching for a part of members may be omitted in order to make it easy to understand the sectional structure of the respective members.

Also, in the specification, the term "main component" means a component whose content is 50 percent by mass or higher in a total content of components contained (100 percent by mass).

Figures 1A, 1B:
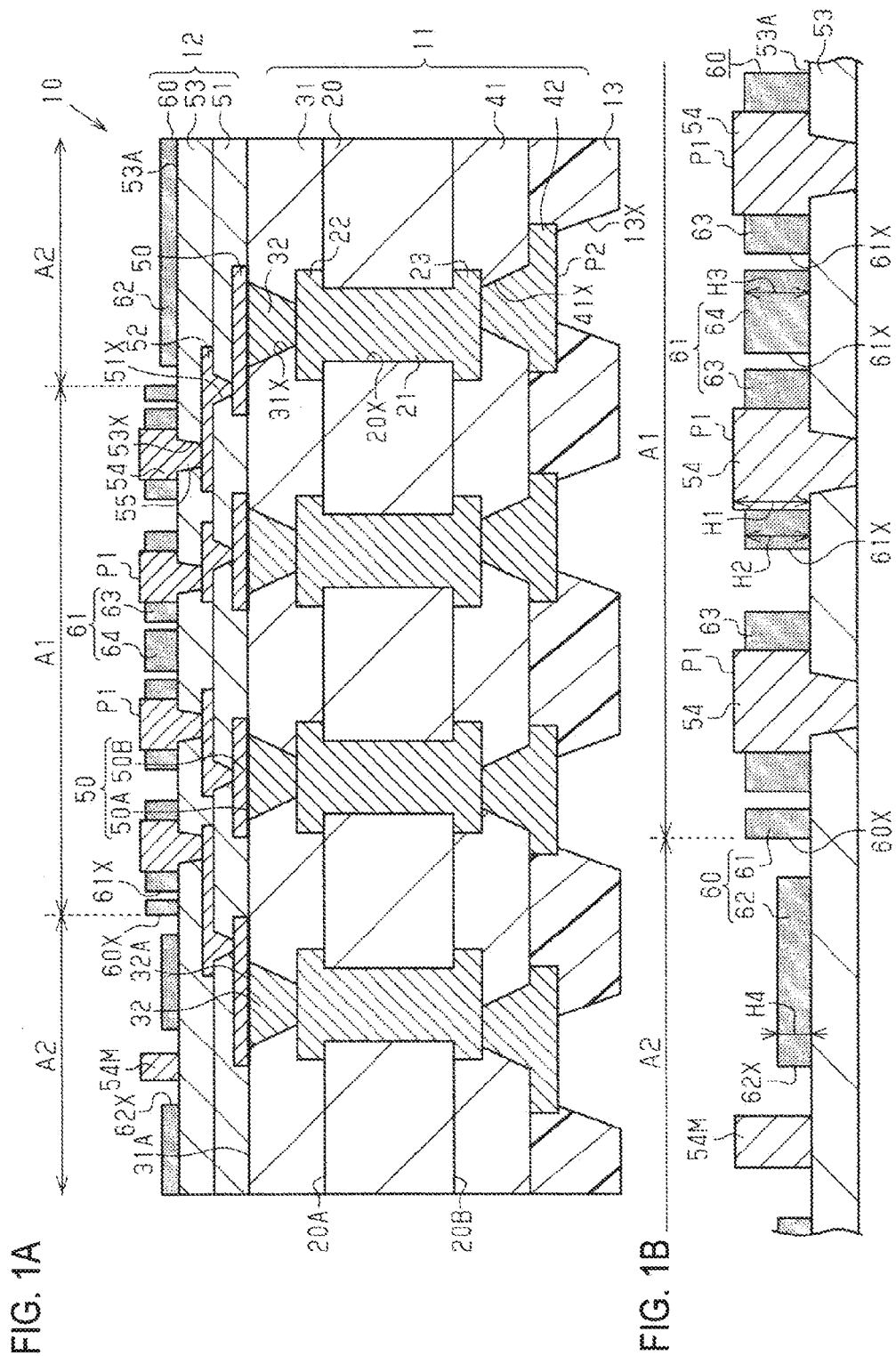
FIG. 1A is a schematic sectional view (sectional view taken along a line 1-1 in FIG. 2) showing a wiring board according to a first exemplary embodiment.
FIG. 1B is an enlarged sectional view in which a part of the wiring board shown in FIG. 1A is enlarged.

As shown in FIG. 1A, a wiring board 10 includes a wiring structure 11 (an example of a first wiring structure), a wiring structure 12 (an example of a second wiring structure), and a solder resist layer 13. The wiring structure 12 is stacked on one side (upper side) of the wiring structure 11. The solder resist layer 13 is stacked on the other side (lower side here) of the wiring structure 11. The wiring board 10 may have any shape and any dimensions in a plan view. For example, the planar shape of the wiring board 10 may be a square shape being in a range of about 20 mm by about 20 mm to about 40 mm by about 40 mm.

At first, the structure of the wiring structure 11 will be described.

The wiring structure 11 is a low-density wiring layer. The wiring structure 11 is provided with wiring layers which are lower in wiring density than those in the wiring structure 12. The wiring structure 11 includes a core substrate 20, an insulating layer 31 stacked on an upper surface 20A of the core substrate 20, and an insulating layer 41 stacked on a lower surface 20B of the core substrate 20.

For example, non-photosensitive insulating resin which contains thermosetting resin as a main component may be used as materials of the core substrate 20 and the insulating layers 31, 41. For example, so-called glass epoxy resin may be used as the materials of the core substrate 20 and the insulating layers 31, 41. The glass epoxy resin is obtained by impregnating glass cloth (glass woven fabric), which serves as a reinforcing material, with thermosetting insulating resin, which contains epoxy resin as a main component. The reinforcing material is not limited to the glass cloth. For example, glass nonwoven fabric, aramid woven fabric, aramid nonwoven fabric, LCP (Liquid Crystal Polymer) woven fabric or LCP nonwoven fabric may be used as the reinforcing material. The thermosetting insulating resin is not limited to epoxy resin. For example, insulating resin such as polyimide resin or cyanate resin may be used as the thermosetting insulating resin. The core substrate 20 and the insulating layers 31, 41 may contain filler such as silica or alumina. Also, non-photosensitive insulating resin, which contains thermosetting resin as a main component but has no reinforcing material, may be used as the materials of the core substrate 20 and the insulating layers 31, 41.

The core substrate 20 is provided near a center of the wiring structure 11 in a thickness direction. The core substrate 20 may be, for example, in a range of about 80 μm to about 800 μm in thickness. The core substrate 20 is formed with through holes 20X at predetermined positions (four positions in FIG. 1A). Each through hole 20X is formed to pass through the core substrate 20 from the upper surface 20A to the lower surface 20B. A through electrode 21 is formed in each through hole 20X so as to pass through the core substrate 20 in the thickness direction. For example, the through hole 20X is filled with the through electrode 21. Although not shown, the through holes 20X and the through electrodes 21 are, for example, formed into substantially circular shapes in a plan view. The through holes 20X and the through electrodes 21 may be, for example, in a range of about 50 μm to about 100 μm in diameter. Pitches of the through holes 20X and the through electrodes 21 may be, for example, in a range of about 100 μm to about 200 μm. Also, for example, copper (Cu) or a copper alloy may be used as a material of the through electrodes 21.

A wiring layer 22 is formed on the upper surface 20A of the core substrate 20. A wiring layer 23 is formed on the lower surface 20B of the core substrate 20. The wiring layers 22, 23 are electrically connected to each other through the through electrodes 21. For example, copper or a copper alloy may be used as materials of the wiring layers 22, 23. The wiring layer 22, 23 may be, for example, in a range of about 15 μm to about 35 μm in thickness. A line and space (L/S) of the wiring layer 22, 23 may be, for example, about 20 μm/20 μm. The term "line and space (L/S)" denotes a width of each wiring and an interval between wirings adjacent to each other.

The insulating layer 31 and via wirings 32 formed in the insulating layer 31 are stacked on the upper surface 20A of the core substrate 20.

The insulating layer 31 is stacked on the upper surface 20A of the core substrate 20 so as to cover the wiring layer 22. The insulating layer 31 is, for example, thinner than the core substrate 20. The insulating layer 31 may be, for example, in a range of about 40 μm to about 75 μm in thickness.

Through holes 31X are formed in the insulating layer 31. The through holes 31X are opened at predetermined positions on an upper surface 31A of the insulating layer 31. The through holes 31X pass through the insulating layer 31 in the thickness direction. Also, the through holes 31X partially expose an upper surface of the wiring layer 22. Each through hole 31X is formed into a tapered shape whose diameter increases from the lower side (core substrate 20 side) toward the upper side (wiring structure 12 side) in FIG. 1A. For example, the through holes 31X are formed into a substantially inverted truncated cone in which an opening diameter of a lower opening end thereof is smaller than an opening diameter of an upper opening end thereof. The opening diameter of the upper opening end of the through holes 31X is, for example, smaller than the diameter of the through electrodes 21. The opening diameter of the upper opening end of the through holes 31X may be, for example, in a range of about 50 μm to about 70 μm.

The upper surface 31A of the insulating layer 31 is a smooth surface (low roughness surface) with less unevenness. For example, the upper surface 31A of the insulating layer 31 is a polished surface. The upper surface 31A of the insulating layer 31 is, for example, smaller in surface roughness than inner side surfaces of the through holes 31X and smaller in surface roughness than a lower surface of the insulating layer 41. The roughness of the upper surface 31A of the insulating layer is, for example, in a range of about 15 nm to about 40 nm in surface roughness (Ra value). On the other hand, the roughness of the inner side surfaces of the through holes 31X and the roughness of the lower surface of the insulating layer 41 are, for example, in a range of about 300 nm to about 400 nm in surface roughness (Ra value). The "surface roughness (Ra value)" is a kind of numerical value expressing surface roughness. The surface roughness (Ra value) is also referred to as "arithmetic average roughness." Specifically, the surface roughness (Ra value) is obtained as follows. That is, absolute values of height varying within a measurement area are measured from a surface serving as an average line, and the measured absolute values are arithmetically averaged.

A via wiring 32 electrically connected to the wiring layer 22 is formed in each through hole 31X. The via wirings 32 are formed to pass through the insulating layer 31 in the thickness direction. In this exemplary embodiment, the through holes 31X are filled with the via wirings 32. Similarly to the through holes 31X, the via wirings 32 in this exemplary embodiment are formed into a substantially inverted truncated cone in which an upper end surface 32A thereof is larger than a lower end surface thereof. The upper end surfaces 32A of the via wirings 32 may be, for example, in a range of about 50 μm to about 70 μm in diameter.

The upper end surface 32A of each via wiring 32 is exposed from the upper surface 31A of the insulating layer 31. The upper end surfaces 32A of the via wirings 32 are, for example, substantially flush with the upper surface 31A of the insulating layer 31. Similarly to the upper surface 31A of the insulating layer 31, the upper end surfaces 32A of the via wirings 32 are smooth surfaces (low roughness surfaces) with less unevenness. For example, the upper end surfaces 32A of the via wirings 32 are polished surfaces. The roughness of the upper end surfaces 32A of the via wirings 32 is, for example, in a range of about 15 nm to 40 nm in surface roughness (Ra value). For example, copper or a copper alloy may be used as a material of the via wirings 32.

The insulating layer 41 and a wiring layer 42 are sequentially stacked on the lower surface 20B of the core substrate 20. The insulating layer 41 is stacked on the lower surface 20B of the core substrate 20 so as to cover the wiring layer 23. The insulating layer 41 is, for example, thinner than the core substrate 20. The insulating layer 41 may be, for example, in a range of about 40 μm to about 75 μm in thickness.

The wiring layer 42 is stacked on the lower surface of the insulating layer 41. The wiring layer 42 is electrically connected to the wiring layer 23. The wiring layer 42 includes via wirings and a wiring pattern. The via wirings are filled in through holes 41X. The wiring pattern is formed on a lower surface of the insulating layer 41. The wiring layer 42 stacked on the lower surface of the insulating layer 41 may be, for example, in a range of about 15 μm to about 35 μm in thickness. A line and space (L/S) of the wiring layer 42 may be, for example, about 20 μm/20 μm. For example, copper or a copper alloy may be used as a material of the wiring layer 42.

Next, the structure of the wiring structure 12 will be described.

The wiring structure 12 is stacked on the upper surface 31A of the insulating layer 31, which is the uppermost layer of the wiring structure 11. The wiring structure 12 is a high-density wiring layer. The wiring structure 12 is provided with wiring layers which are higher in wiring density than those of the wiring structure 11.

The wiring structure 12 has a structure that a wiring layer 50 stacked on the insulating layer 31, an insulating layer 51, a wiring layer 52, an insulating layer 53, a wiring layer 54 and a protection layer 60 are sequentially stacked.

Here, for example, insulating resin, which contains photosensitive resin such as phenolic resin or polyimide resin as a main component, may be used as materials of the insulating layers 51, 53. Those insulating layers 51, 53 may contain filler such as silica or alumina.

Also, the wiring layers 50, 52, 54 are wiring layers which are thinner than the wiring layers of the wiring structure 11. The wiring layers 50, 52 formed on the insulating layers 31, 51 may be, for example, in a range of about 1 μm to about 3 μm in thickness. The wiring layer 54 formed on the insulating layer 53 may be, for example, in a range of about 10 μm to about 15 μm in thickness. A width of wirings and an interval between wirings adjacent to each other in the wiring layers 50, 52, 54 are respectively smaller than the width of the wirings and the interval between the wirings adjacent to each other in the wiring layers 22, 23, 42 of the wiring structure 11. A line and space (L/S) of each wiring layer 50, 52, 54 may be, for example, about 2 μm/2 μm. Also, the insulating layers 51, 53 are insulating layers thinner than the insulating layers 31, 41 in the wiring structure 11. The insulating layers 51, 53 may be, for example, in a range of about 3 μm to about 10 μm in thickness.

The wiring layer 50 is stacked on the upper surface 31A of the insulating layer 31 so as to be connected to the upper end surfaces 32A of the via wirings 32. That is, parts of the lower surface of the wiring layer 50 is in contact with the upper end surfaces 32A of the via wirings 32 so that the wiring layer 50 is electrically connected to the via wirings 32. In other words, the wiring layer 50 and the via wirings 32 are electrically connected to each other but are not integrated with each other. Specifically, for example, the wiring layer 50 includes a seed layer 50A (for example, a stacked body of a titanium (Ti) layer and a copper (Cu) layer) and a metal layer 50B (for example, a copper (Cu) layer) as shown in FIGS. 8A and 8B. The seed layer 50A is formed on the upper end surfaces 32A of the via wirings 32 (for example, a Cu layer). The metal layer 50B is formed on the seed layer 50A. That is, the metal layer 50B is connected to the via wiring 32 through the seed layer 50A.

The seed layer 50A is formed to cover the upper end surfaces 32A of the via wirings 32 and to cover the upper surface 31A of the insulating layer 31 near the upper end surfaces 32A. The metal layer 50B is formed to cover the entire upper surface of the seed layer 50A.

The insulating layer 51 is formed on the upper surface 31A of the insulating layer 31 so as to cover the wiring layer 50. Through holes 51X are formed at predetermined positions in the insulating layer 51 so as to pass through the insulating layer 51 in the thickness direction. Thus, parts of the upper surface of the wiring layer 50 are exposed in the through holes 51X.

The wiring layer 52 is stacked on the upper surface of the insulating layer 51. The wiring layer 52 is electrically connected to the wiring layer 50. The wiring layer 52 includes via wirings and a wiring pattern. The via wirings are filled in the through holes 51X. The wiring pattern is formed on the upper surface of the insulating layer 51. For example, copper or a copper alloy may be used as a material of the wiring layer 52.

The insulating layer 53 is formed on the upper surface of the insulating layer 51 so as to cover the wiring layer 52. Through holes 53X are formed at predetermined positions in the insulating layer 53 so as to pass through the insulating layer 53 in the thickness direction. Thus, parts of the upper surface of the wiring layer 52 are exposed in the through holes 53X.

Here, the through holes 51X, 53X are formed into a tapered shape whose diameter increases from the lower side (wiring structure 11 side) toward the upper side (wiring layer 54 side) in FIG. 1A. For example, the through holes 51X, 53X are formed into a substantially inverted truncated cone in which the opening diameters of upper opening ends thereof are larger than the opening diameters of lower opening ends thereof. The opening diameter of the upper opening ends of the through holes 51X may be, for example, in a range of about 10 μm to about 20 μm.

The wiring layer 54 and a recognition mark 54M are formed on an upper surface 53A of the insulating layer 53. The wiring layer 54 includes via wirings 55 and connection terminals P1. The via wirings 55 are tilled in the through holes 53X. The connection terminals P1 protrude upward from the upper surface 53A of the insulating layer 53. Each connection terminal P1 is, for example, a columnar connection terminal (an example of a metal post) that extends upward from the upper surface 53A of the insulating layer 53. On the other hand, the recognition mark 54M is, for example, formed into a columnar shape so as to extend upward from the upper surface 53A of the insulating layer 53. For example, copper or a copper alloy may be used as a material of the via wirings 55 and a material of the connection terminals P1.

As shown in FIG. 1B, the connection terminals P1 are formed in a mounting region A1 where electronic components such as semiconductor chips are to be mounted. Each connection terminal P1 serves as an electronic component mounting pad to be electrically connected to the electronic components. On the other hand, the recognition mark 54M is formed in an outer peripheral region A2 outside the mounting region A1. For example, the recognition mark 54M serves as an alignment mark.

Figure 2:
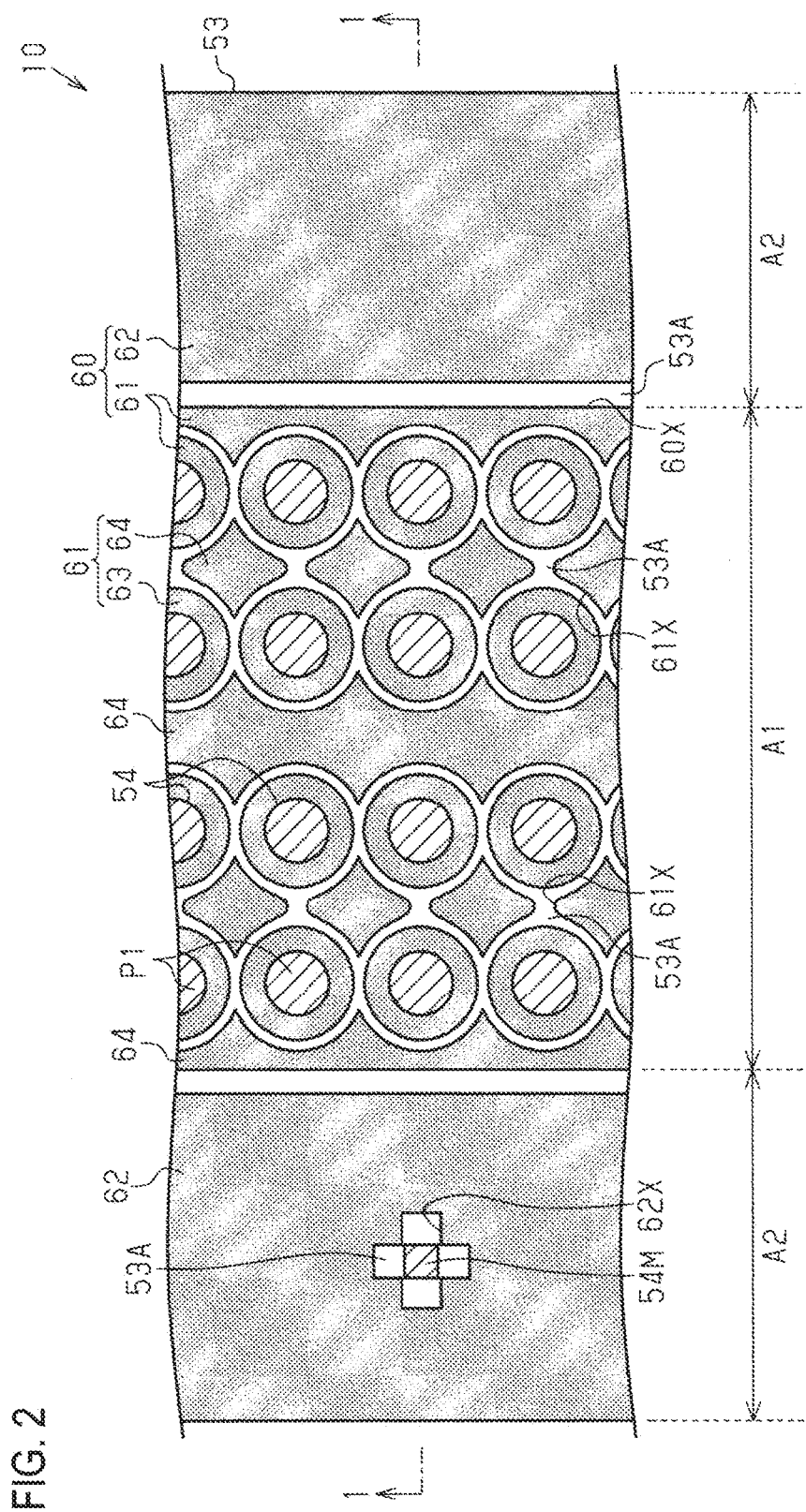
FIG. 2 is a schematic plan view showing the wiring board according to the first exemplary embodiment.

As shown in FIG. 2, the plural connection terminals P1 are formed in a matrix form in a plan view on the upper surface 53A of the insulating layer 53 in the mounting region A1. Each connection terminal P1 is, for example, formed into a substantially circular shape in a plan view. That is, each connection terminal P1 of this exemplary embodiment is formed into a substantially columnar shape. On the other hand, the recognition mark 54M is, for example, formed into a different shape from the connection terminal P1 in a plan view. The recognition mark 54M of this exemplary embodiment is, for example, formed into a substantially rectangular shape in a plan view. That is, the recognition mark 54M of this exemplary embodiment is formed into a substantially quadrangular prism-like shape.

As shown in FIG. 1B, the connection terminals P1 are substantially as high as the recognition mark 54M. The connection terminals P1 and the recognition mark 54M may be, for example, in a range of about 10 μm to about 20 μm in height. A diameter of the connection terminals P1 may be, for example, in a range of about 20 μm to about 30 μm. A pitch of the connection terminals P1 may be, for example, in a range of about 40 μm to about 60 μm.

A surface treatment layer may be formed on a surface(s) (upper and side surfaces or only the upper surface) of each connection terminal P1 in accordance with necessity. Examples of the surface treatment layer include a gold (Au) layer, a nickel (Ni) layer/Au layer (a metal layer in which a Ni layer and an Au layer are stacked in this order), a Ni layer/palladium (Pd) layer/Au layer (a metal layer in which a Ni layer, a Pd layer and an Au layer are stacked in this order), etc. For example, metal layers (electroless plating metal layers) may be used as the Ni layer, the Au layer and the Pd layer. Also, the Ni layer is a metal layer made of Ni or a Ni alloy The Au layer is a metal layer made of Au or an Au alloy. The Pd layer is a metal layer made of Pd or a Pd alloy. Also, the surface treatment layer may be formed by oxidation prevention treatment such as OSP (Organic Solderability Preservative) treatment applied to the surface (upper and side surfaces or only the upper surface) of the connection terminal P1.

The protection layer 60 is formed on the upper surface 53A of the insulating layer 53. The protection layer 60 covers the side surface of the wiring layer 54. The protection layer 60 includes a protection layer 61 formed in the mounting region A1, and a protection layer 62 formed in the outer peripheral region A2. A groove-like opening portion 60X is formed between the protection layer 61 and the protection layer 62. The like opening portion 60X exposes the upper surface 53A of the lower insulating layer 53. The protection layer 61 and the protection layer 62 are separated from each other by the opening portion 60X. The opening portion 60X is, for example, formed in an annular shape to surround the mounting region A1.

The protection layer 61 includes protection insulating layers 63 and protection insulating layers 64. The protection insulating layers 63 are provided so as to correspond to the respective connection terminals P1. The protection insulating layers 64 are formed to be separated from the protection insulating layers 63.

Each protection insulating layer 63 is in contact with a part of the side surface of the corresponding connection terminal P1 and covers the side surface of the connection terminal P1. Each protection insulating layer 63 is formed into a ring shape to surround the corresponding connection terminal P1, which is formed into a substantially columnar shape. That is, the protection insulating layers 63 of this exemplary embodiment are formed into a substantially cylindrical shape. A thickness H2 of the protection insulating layers 63 is equal to or less than a thickness H1 of the connection terminals P1. The thickness H2 of the protection insulating layers 63 of this exemplary embodiment is thinner than the thickness H1 of the connection terminals P1. Thus, the upper surface of each connection terminal P1 and a part of the side surface of the connection terminal P1 on an upper end side thereof are exposed from the corresponding protection insulating layer 63.

The protection insulating layers 64 are formed in, among the mounting region A1, a region where the protection insulating layers 63 are not formed. Specifically, each protection insulating layer 64 is formed on the upper surface 53A of the insulating layer 53 and between adjacent ones of the protection insulating layers 63. The protection insulating layers 64 may have any shape and any dimensions in a plan view. As shown in FIG. 2, the protection insulating layers 64 may be formed into a substantially diamond-like shape in a plan view, or the protection insulating layer 64 may be formed into a substantially belt-like shape in a plan view to extend in one direction (here, an up and down direction in FIG. 2). Alternatively, the protection insulating layers 64 may be formed into a substantially cross shape in a plan view to extend in two directions example, the up and down direction and a right and left direction in FIG. 2). A thickness H3 (see FIG. 1B) of the protection insulating layers 64 may be, for example, substantially equal to the thickness H2 (see FIG. 1B) of the protection insulating layers 63.

Opening portions 61X are formed in the protection layer 61. The opening portions 61X are located between adjacent ones of the protection insulating layers 63 and between the protection insulating layers 63, 64. The opening portions 61X expose the upper surface 53A of the lower insulating layer 53. The opening portions 61X are formed in an annular shape (here, substantially a ting circle shape) to surround the protection insulating layers 63, respectively. The opening portions 61X of this exemplary embodiment are formed into consecutive "8"-shapes in a plan view Adjacent ones of the protection insulating layers 63 are separated from each other by the opening portions 61X so that the protection insulating layers 63, 64 are separated from each other. In other words, the protection insulating layers 63, 64 are defined by the opening portions 61X.

The protection layer 62 is formed to entirely cover the upper surface 53A of the insulating layer 53 in the outer peripheral region A2. The protection layer 62 is, for example, formed solidly. As shown in FIG. 1B, the protection layer 62 is thinner than the protection layer 61. That is, a thickness H4 of the protection layer 62 is thinner than the thickness H2 of the protection insulating layers 63 and thinner than the thickness H3 of the protection insulating layers 64.

For example, an opening portion 62X is formed in the protection layer 62. The opening portion 62X exposes the recognition mark 54M. The protection layer 62 is separated from the recognition mark 54M by the opening portion 62X. The opening portion 62X is formed to pass through the protection layer 62 in the thickness direction. The opening portion 62X exposes the upper surface 53A of the lower insulating layer 53. As shown in FIG. 2, the opening portion 62X may have any shape and any dimensions in a plan view. The opening portion 62X of this exemplary embodiment is formed into a substantially cross shape in a plan view. The recognition mark 54M has a substantially rectangular shape in a plan view The recognition mark 54M is formed in a center portion of the opening portion 62X in a plan view.

For example, insulating resin which contains photosensitive resin as a main component may be used as a material of the protection layer 60 described above, that is a material of the protection layer 61 (the protection insulating layers 63, 64) and a material of the protection layer 62. For example, a material similar to that of the insulating layer 53 or solder resist may be used as the material of the protection layer 60.

As shown in FIG. 1A, the solder resist layer 13 is an insulating layer which is the outermost layer (here, the lowermost layer) formed on the lower surface of the wiring structure 11. The solder resist layer 13 is stacked on the lower surface of the insulating layer 41, which is formed as the lowermost layer of the wiring structure 11. The solder resist layer 13 covers the lowermost wiring layer 42 of the wiring structure 11.

Opening portions 13X are formed in the solder resist layer 13. The opening portions 13X expose parts of the lowermost wiring layer 42 which serve as external connection pads P2. External connection terminals 86 (see FIG. 3) such as solder balls or lead pins can be connected to the external connection pads P2. The external connection terminals 76 will be used to mount the wiring board 10 on a mounting board such as a mother board. A surface treatment layer may be foamed on parts of the wiring layer 42 which are exposed from the opening portions 13X, in accordance with necessity. Examples of the surface treatment layer include an Au layer, a Ni layer Au layer, a Ni layer/Pd layer/Au layer, etc. Alternatively, the surface treatment layer may be formed by applying oxidation prevention treatment such as OSP treatment to the external connection terminals P2. The wiring layer 42 exposed from the opening portions 13X (or the surface treatment layer when the surface treatment layer is formed on the wiring layer 42) itself may be used as an external connection terminal.

The opening portions 13X and the external connection pads P2 may have any shape and any dimensions in a plan view. For example, the opening portions 13X and the external connection pads P2 may be formed into a circular shape and have a diameter of about 200 µm to about 300 µm in a plan view. For example, photosensitive insulating resin which contains phenolic resin or polyimide resin as a main component may be used as a material of the solder resist layer 13. The solder resist layer 13 may contain filler such as silica or alumina.

Next, the structure of a semiconductor device 70 will be described with reference to FIG. 3.

The semiconductor device 70 includes the wiring substrate 10, one or plural (here, two) semiconductor chips 80, underfill resin 85 and the external connection terminals 86.

The semiconductor Chips 80 are mounted on the wiring board 10 in a flip-chip manner. That is, connection terminals 81 are disposed on a circuit formation surface (here, a lower surface) of the semiconductor chip 80. The connection terminals 81 are joined to the connection terminals P1 of the wiring substrate 10 through joining members 82. Thus, the semiconductor chips 80 are electrically connected to the wiring layer 54 through the connection terminals 81 and the joining members 82.

Logic chips such as CPU (Central Processing Unit) chips or GPU (Graphics Processing Unit) chips may be used as the semiconductor chips 80. Memory chips such as DRAM (Dynamic Random Access Memory) chips, SRAM (Static Random Access Memory) chips or flash memory chips may be also used as the semiconductor chips 80. Where plural semiconductor chips 80 are mounted on the wiring board 10, logic chips and memory chips may be combined and mounted on the wiring board 10. For example, a CPU chip and a DRAM chip may be mounted on ale wiring board 10, or a GPU chip and a DRAM chip may be mounted on the wiring board 10.

A size of each semiconductor chip 80 may be, for example, in a range of about 3 mm by 3 mm to about 12 mm by 12 mm in a plan view. Also, each semiconductor chip 80 may be, for example, in a range of about 50 µm to about 100 µm in thickness.

For example, a metal post may be used as each connection terminal 81. The connection terminals 81 are columnar connection terminals extending downward from the circuit formation surface of the semiconductor chip 80. The connection terminals 81 of the exemplary embodiment are, for example, formed into a columnar shape. The connection terminals 81 thus configured may be, for example, in a range of about 10 µm to about 20 µm in height. A diameter of the connection terminal 81 may be, for example, in a range of about 20 µm to about 30 µm. Also, a pitch among the connection terminals 81 may be, for example, in a range of about 40 µm to about 60 µm. Examples of a material of each connection terminal 81 may include copper and a copper alloy. For example, a gold bump may be used as the connection terminals 81 instead of the metal post.

The joining members 82 are joined to the wiring layer 54, and also joined to the connection terminals 81. Examples of the joining members 82 include a tin (Sn) solder plating or a lead (Pb) free solder plating. Examples of a material of the solder plating include a lead free solder such as Sn-silver (Ag) based solder, Sn—Cu based solder or Sn—Ag—Cu based solder. Each joining member 82 may be, for example, in a range of about 5 µm to about 15 µm in thickness.

The underfill resin 85 is provided so as to fill a gap between the wiring substrate 10 and each semiconductor chip 80. The underfill resin 85 is also formed so as to fill the opening portions 61X of the protection layer 61. For example, insulating resin such as epoxy resin may be used as a material of the under-fill resin 85.

The external connection terminals 86 are formed on the external connection pads P2 of the wiring substrate 10. The external connection terminals 86 are, for example, connection terminals to be electrically connected to pads provided on a not-shown mounting board such as a mother board. For example, solder balls or lead pins may be used as the external connection terminals 86. In this exemplary embodiment, solder balls are used as the external connection terminals 86.

In this exemplary embodiment, the wiring structure 11 is an example of a first wiring structure; the wiring structure 12 is an example of a second wiring structure; the wiring layer 22 is an example of a second wiring layer; the insulating layer 31 is an example of a second insulating layer; and the via wirings 32 are an example of a second via wiring. Also, the wiring layer 52 is an example of a first wiring layer; the insulating layer 53 is an example of a first insulating layer; the via wirings 55 are an example of a first via wiring; and the semiconductor chips 80 are an example of an electronic component.

Next, the operation of the wiring board 10 and the operation of the semiconductor device 70 will be described.

The protection layer 60 (the protection insulating layers 63 of the protection layer 61) is formed on the upper surface 53A of the uppermost insulating layer 53 of the wiring structure 12. The protection layer 60 (the protection insulating layers 63 of the protection layer 61) is in contact with the side surfaces of the columnar connection terminals P1 and surround the connection terminals P1. With this configuration, while the lower surfaces of the connection terminals Pi are in contact with the upper surface 53A of the insulating layer 53, parts of the side surfaces of the connection terminals P1 are in contact with the protection layer 60. Thus, the interface between the connection terminals P1 and the photosensitive resin layers (the insulating layer 53 and the protection layer 60) is increased in comparison with the case where the protection layer 60 is not formed. Accordingly, thermal stress caused by a difference in thermal expansion coefficient between the connection terminals P1 and the photosensitive resin layers can be dispersed, so that stress concentrated on one place can be reduced. As a result, it is possible to suitably suppress cracks from occurring in the interface between the connection terminals P1 and the photosensitive resin layers.

Next, a method for manufacturing the wiring board 10 will be described. In the following description, one wiring board 10 will be enlarged and explained. In fact, however, members serving as plural wiring boards 10 are collectively manufactured on a single substrate, and the wiring boards 10 are then divided into individual products.

Figure 4A:
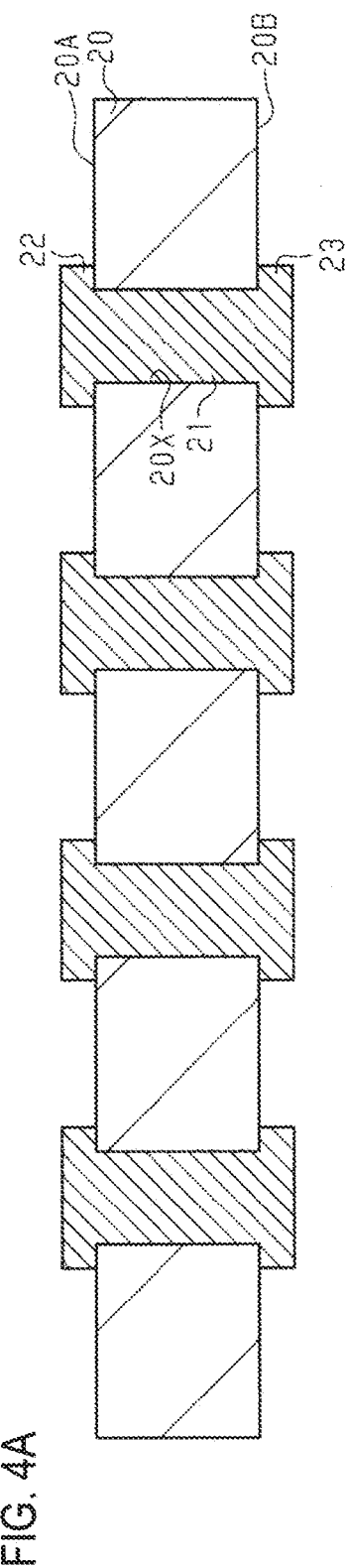
FIGS. 4A and 4B are schematic sectional views showing a method for manufacturing the wiring board according to the first exemplary embodiment.

At first, in a step shown in FIG. 4A, through holes 20X are, for example, formed in a CCL (Copper Clad Laminate) serving as a core substrate 20. Then, through electrodes 21 are formed in the through holes 20X by a method of electrolytic plating, paste filling or the like. After that, for example, by a subtractive method, a wiring layer 22 is formed on an upper surface 20A of the core substrate 20 while a wiring layer 23 is formed on a lower surface 20B of the core substrate 20.

Figure 4B:
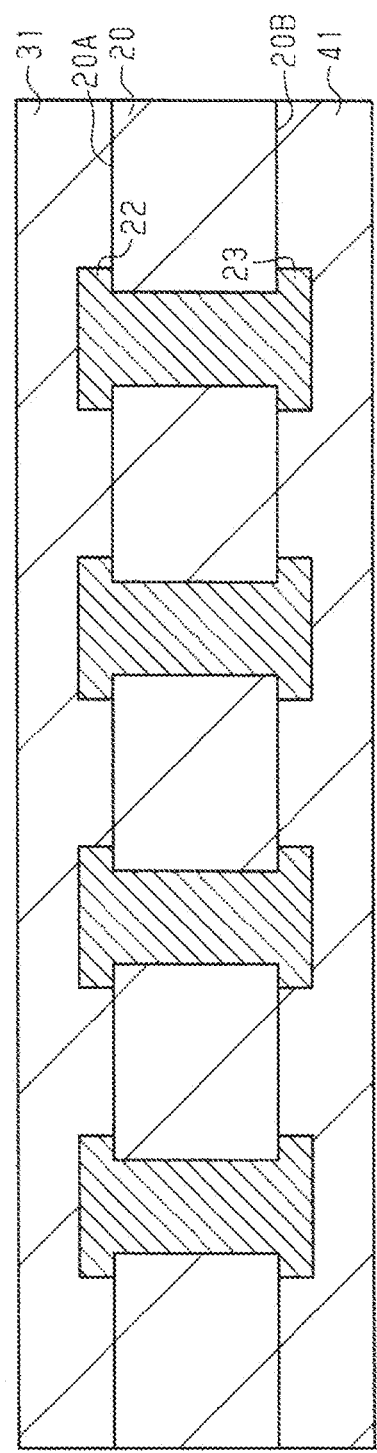

Next, in a step shown in FIG. 4B, an insulating layer 31 is formed to cover the upper surface 20A of the core substrate 20 and the wiring layer 22. Also, an insulating layer 41 is formed to cover the lower surface 20B of the core substrate 20 and the wiring layer 23. Where a resin film is used as the insulating layers 31, 41, the upper surface 20A and the lower surface 2013 of the core substrate 20 are, for example, laminated with the resin film. Then, while pressure is applied to the resin film, heat treatment at a temperature (for example, about 130° C. to about 200° C.) which is equal to or higher than the curing temperature of the resin film is applied to the resin film so as to cure the resin film. Thus, the insulating layers 31, 41 are formed. On this occasion, by laminating the resin film in a vacuum atmosphere, entrainment of voids can be prevented. For example, a film of thermosetting resin. Which contains epoxy resin as a main component, may be used as the resin film. On the other hand, where liquid or paste insulating resin is used for the insulating layers 31, 41, the liquid or paste insulating resin is applied to the upper surface 20A and the lower surface 20B of the core substrate 20 by a spin coating method or the like. Then, heat treatment at a temperature which is equal to or higher than the curing temperature of the applied insulating resin is applied to the insulating resin so as to cure the insulating resin. Thus, the insulating layers 31, 41 are formed. For example, thermosetting resin, which contains epoxy resin as a main component, may be used as the liquid or paste insulating resin.

Next, in a step shown in FIG. 5A, through holes 31X are formed at predetermined position in the insulating layer 31 so as to partially expose the upper surface of the wiring layer 22. Also, through holes 41X are formed at predetermined positions in the insulating layer 41 so as to partially expose the lower surface of the wiring layer 23. The through holes 31X, 41X are, for example, formed by a laser processing method using a $CO_2$ laser, a UV-YAG laser or the like. Next, where the through holes 31X, 41X are formed by the laser processing method, desmear treatment is performed to remove resin smear adhering to the surfaces of the wiring layers 22, 23 which are exposed in the bottom portions of the through holes 31X, 41X. The desmear treatment roughens the inner side surfaces of the through holes 31X, the upper surface 31A of the insulating layer 31, the inner side surfaces of the through holes 41X, and the lower surface of the insulating layer 41.

Next, in a step shown in FIG. 5B, a wiring layer 42 including via wirings and a wiring pattern is formed. The via wirings are filled in the through holes 41X of the insulating layer 41. The wiring pattern is electrically connected to the wiring layer 23 through the via wirings. The wiring pattern is stacked on the lower surface of the insulating layer 41. The wiring layer 42 can be, for example, formed using various wiring formation methods such as a semi-additive method, a subtractive method, or the like.

Also, in the step shown in FIG. 5B, a seed layer (not shown) is formed. The seed layer covers the whole surface of the insulating layer 31 including the inner surfaces of the through holes 31X and the whole upper surface of the wiring layer 22, which is exposed from the through holes 31X. Electrolytic plating is carried out using the seed layer as a power feeding layer. For example, the seed layer is formed by an electroless copper plating method, and the electrolytic copper plating method is carried out using the seed layer as the power feeding layer. Thereby, a conductive layer 100 is formed. The conductive layer 100 fills the through holes 31X and covers the whole surface of the upper surface 31A of the insulating layer 31.

Next, for example, by a CMP (Chemical Mechanical Polishing) method or the like, the conductive layer 100 which protrudes from the upper surface 31A of the insulating layer 31 is polished, and the upper surface 31A of the insulating layer 31 which is the roughened surface is partially polished. Thereby, as shown in FIG. 6A, via wirings 32 filled in the through holes 31X are formed. Also, upper end surfaces 32A of the via wirings 32 are formed to be substantially flush with the upper surface 31A of the insulating layer 31. Furthermore, the upper surface 31A of the insulating layer 31 is partially polished so that the upper surface 31A of the insulating layer 31 becomes smooth. For example, where the roughness of the upper surface 31A of the insulating layer 31 before polishing is in a range of about 300 nm to about 400 nm in surface roughness (Ra value), the polishing can make the roughness of the upper surface 31A of the insulating layer 31 be in a range of about 15 nm to about 40 nm in surface roughness (Ra value) in other words, in this step, the upper surface 31A of the insulating layer 31 is polished so that the upper surface 31A of the insulating layer 31 becomes smooth (for example, to be in a range of about 15 nm to about 40 nm in surface roughness (Ra value)). It is noted that the inner side surfaces of the through holes 31X and the lower surface of the insulating layer 41 are kept rough. Therefore, the upper surface 31A of the insulating layer 31 becomes smaller in surface roughness than the inner side surfaces of the through holes 31X and the lower surface of the insulating layer 41. By the polishing in this step, the upper surface 31A of the insulating layer 31 and the upper end surfaces 324 of the via wirings 32 become polished surfaces.

The wiring structure 11 is manufactured by the above-described manufacturing steps.

Next, in a step shown in FIG. 6B, a seed layer 50A is formed to cover the whole upper surface 31A of the insulating layer 31 and the whole upper end surfaces of the via wirings 32 The seed layer 50A is formed, for example, by a sputtering method or an electroless plating method. For example, since the upper surface 31A of the insulating layer 31 is the smooth surface, the seed layer 50A can be formed uniformly on the upper surface 31A by the sputtering method, and the upper surface of the seed layer 504 can be formed to be smooth. Therefore, the seed layer 50A can be formed to be thinner than in the case where the seed layer 50A is formed on a roughened surface by a sputtering method. For example, when the seed layer 50A is formed by a sputtering method, titanium (Ti) is deposited to form a Ti layer on the upper surface 31A of the insulating layer 31 and the upper end surface 32A of each via wiring 32 by sputtering so that the upper surface 31A and the upper end surface 324 can be covered with the Ti layer. After that, copper is deposited to form a Cu layer on the Ti layer by sputtering. Thus, the seed layer 504 can be formed as a double-layer structure (Ti layer/Cu layer). In this manner, the Ti layer is formed as a lower layer of the seed layer 50A so that the adhesion between the insulating layer 31 and the seed layer 504 can be improved. The Ti layer may be replaced by a TiN layer made of titanium nitride (TN). In this case, the seed layer 504 is formed as a double-layer structure consisting of the TiN layer and the Cu layer. Here, titanium or titanium nitride is a metal which is higher in corrosion resistance than copper Also, when the seed layer 50A is formed by the electroless plating method, the seed layer 50A made of a Cu layer (single-layer structure) can be formed by the electroless copper plating method.

Plasma treatment such as $O_2$ plasma ashing or the like may be applied to the upper surface 31A of the insulating layer 31 before the seed layer 50A is formed. If the plasma treatment is carried out, the upper surface 314 of the insulating layer 31 is roughened. By roughening the upper surface 31A of the insulating layer 31, the adhesion between the seed layer 504 and the insulating layer 31 can be enhanced. However, it should be noted that minute wiring can be formed on the upper surface 31A by reducing the roughness of the upper surface 31A of the insulating layer 31 to improve the smoothness thereof. Therefore, where the plasma treatment is carried out, the upper surface 31A of the insulating layer 31 should be roughened to an extent that formation of minute wiring will not be hindered in a subsequent step.

Figure 7A:
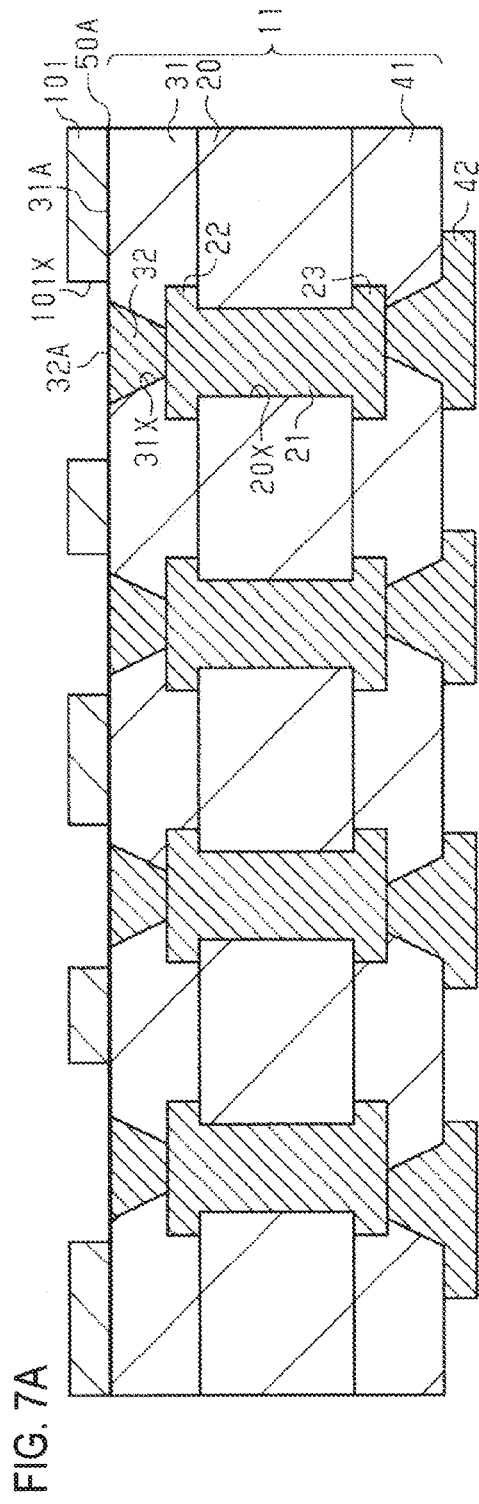
FIGS. 7A and 7B are schematic sectional views showing the method for manufacturing the wiring board according to the first exemplary embodiment.

Next, in a step shown in FIG. 7A, a resist layer 101 having an opening pattern 101X at a predetermined position is formed on the seed layer 50A. The opening pattern 101X is formed to expose the seed layer 50A in a portion corresponding to the wiring layer 50 (see FIGS. 1A and 1B). For example, a material having plating resistance against plating treatment in a subsequent step may be used as a material of the resist layer 101. For example, photosensitive dry film resist (for example, dry film resist of novolac resin, acrylic resin or the like) or liquid photoresist (for example, liquid resist of novolac resin, acrylic resin or the like), etc. may be used as a material of the resist layer 101. For example, where photosensitive dry film resist is used, a dry film is laminated on an upper surface of the seed layer 50A by thermocompression bonding, and the dry film is patterned by a photolithographic method. Thereby, the resist layer 101 having the opening pattern 101X is formed. Where liquid photoresist is used, the resist layer 101 can be formed in a similar step. The upper surface of the seed layer 50A. is a smooth surface in this step. Therefore, failure in patterning can be suppressed from occurring in the resist layer 101 formed on the seed layer 50A. That is, the opening pattern 101X can be formed in the resist layer 101 with high accuracy.

Figure 7B:
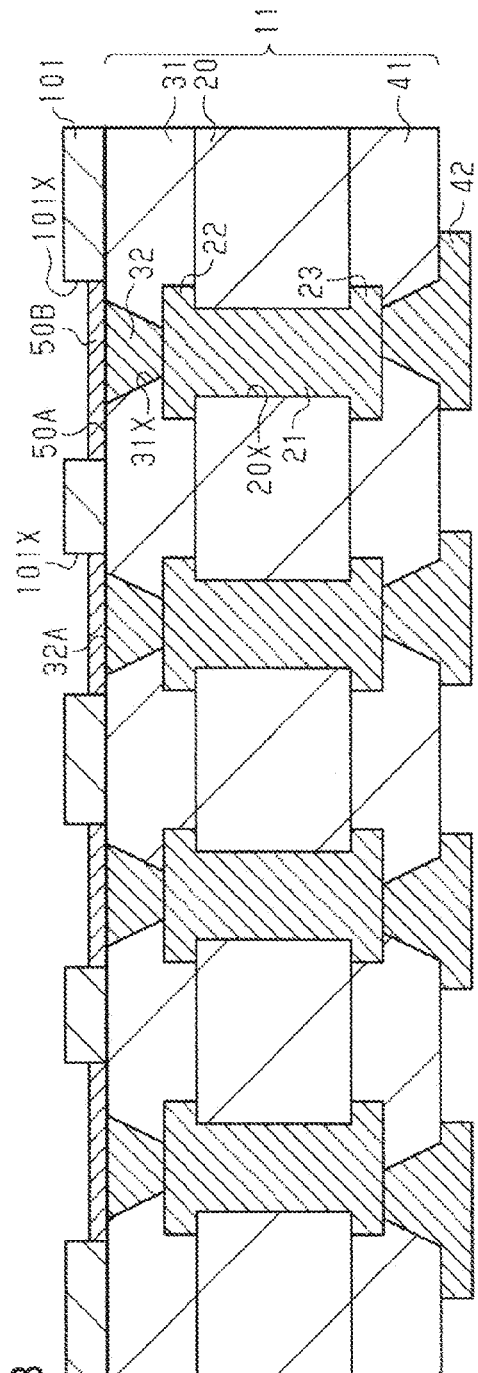

Next, in a step shown in FIG. 7B, an electrolytic plating method is carried out for the upper surface of the seed layer 50A. The electrolytic plating method uses the resist layer 101 as a plating mask and uses the seed layer 50A as a power feeding layer. Specifically, the electrolytic plating method (here, an electrolytic copper plating method) is applied to the upper surface of the seed layer 50A exposed from the opening pattern 101X of the resist layer 101. Thereby, a metal layer 50B (electrolytic plating metal layer) is formed on the upper surface of the seed layer 50A.

Subsequently, the resist layer 101 is, for example, removed by an alkaline peeling solution. Next, unnecessary parts of the seed layer 50A are removed by etching using the metal layer 50B as an etching mask. Thus, as shown in FIG. 8A, the wiring layer 50 are formed on the upper end surfaces 32A of the via wirings 32 and the upper surface 31A of the insulating layer 31. As shown in FIG. 8B, the wiring layer 50 includes the seed layer 50A and the metal layer 50B. The seed layer 50A is in contact with the upper end surfaces 32A of the via wirings 32. The metal layer 50B is formed on the seed layer 50A. In this manner, the wiring layer 50 is formed by the semi-additive method. Also, the wiring layer 50 is formed in a separate step from the step in which the via wirings 32 are formed. Thus, the wiring layer 50 and the via wirings 32 are not formed integrally.

Next, in a step shown in FIG. 9A, an insulating layer 51 is formed on the upper surface 31A of the insulating layer 31 so as to cover the entire surface (upper surface and side surface) of the wiring layer 50. Where a resin film is used as the insulating layer 51, the resin film is, for example, laminated on the upper surface 31A of the insulating layer 31 by thermocompression bonding. Thereby, the insulating layer 51 is formed. On this occasion, if the resin film is laminated in a vacuum atmosphere, entrainment of voids can be prevented. For example, a film of photosensitive resin such as phenolic resin or polyimide resin may be used as the resin film. On the other hand, where liquid or paste insulating resin is used for the insulating layer 51, the liquid or paste insulating resin is applied to the upper surface 31 A of the insulating layer 31 by a spin coating method or the like. Thereby, the insulating layer 51 is formed. For example, photosensitive resin such as phenolic resin or polyimide resin may be used as the liquid or paste insulating resin.

Next, in a step shown in FIG. 9B, through holes 51X are formed at predetermined positions in the insulating layer 51, for example, by a photolithographic method. The through holes 51X pass through the insulating layer 51 in the thickness direction and expose the upper surface of the wiring layer 50. The roughness of the upper surface of the insulating layer 51 made of photosensitive resin may be, for example, in a range of about 2 nm to about 10 nm in surface roughness (Ra value). That is, the upper surface of the insulating layer 51 is lower in surface roughness than the inner side surfaces of the through holes 31X and lower in surface roughness than the upper surface 31A of the insulating layer 31.

Figure 10:
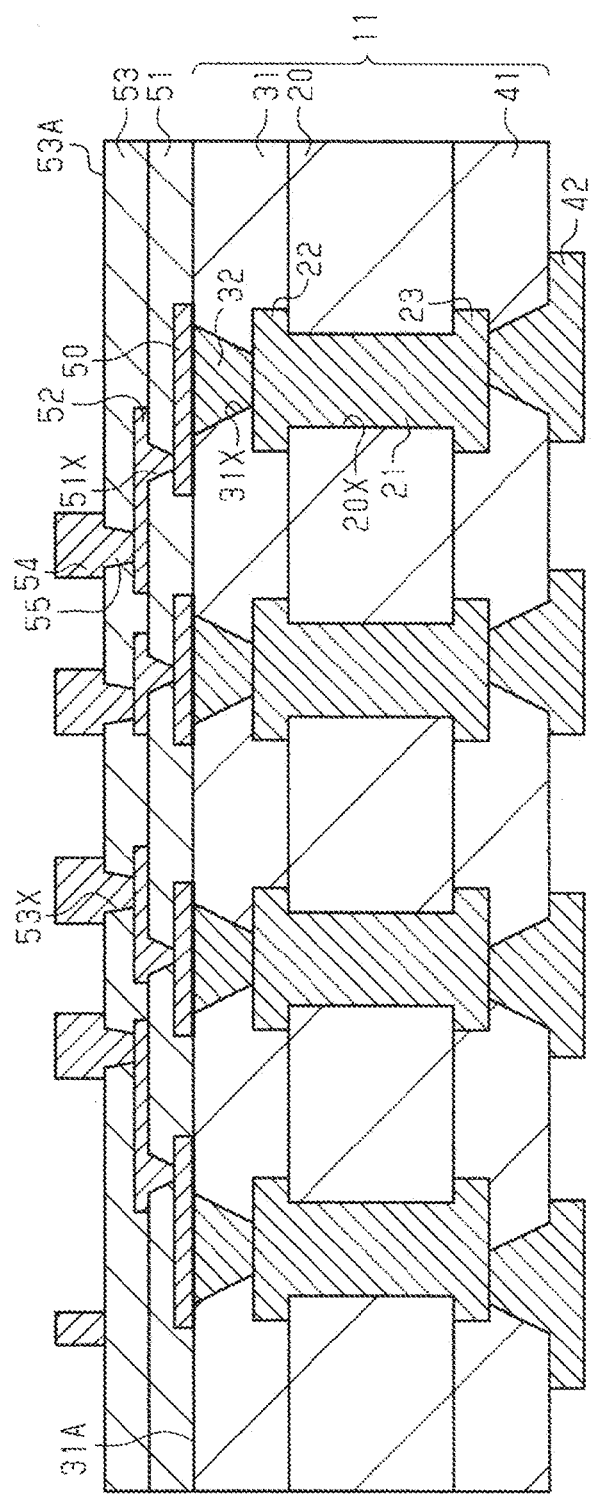
FIG. 10 is a schematic sectional view showing the method for manufacturing the wiring board according to the first exemplary embodiment.
Figure 11:
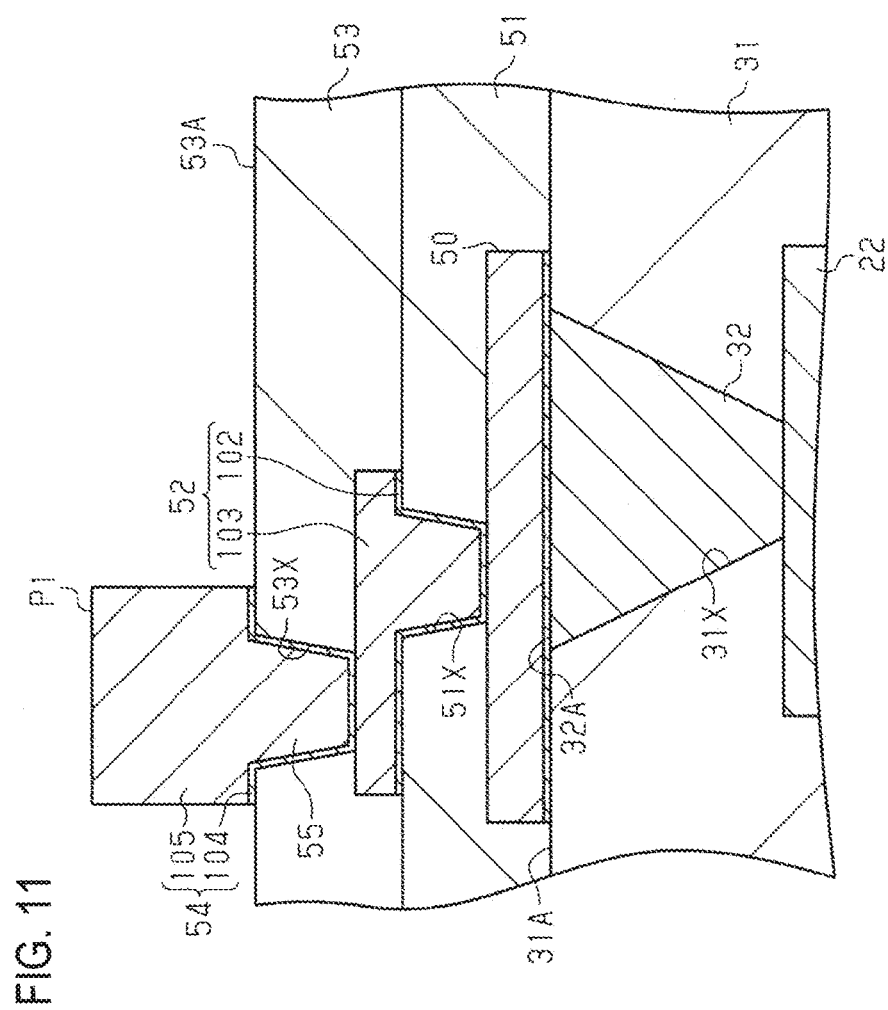
FIG. 11 is a schematic sectional view showing the method for manufacturing the wiring board according to the first exemplary embodiment.

Next, in a step shown in FIG. 10, a wiring layer 52 including via wirings and a wiring pattern is formed, for example, by a semi-additive method in the same manner as the steps shown in FIG. 6B to FIG. 8B. The via wirings are filled in the through holes SIX. The wiring pattern is electrically connected to the wiring layer 50 through the via wirings and stacked on the upper surface of the insulating layer 51. On this occasion, the wiring layer 52 includes a seed layer 102 and an electrolytic copper plating layer 103. The seed layer 102 covers the whole inner surfaces of the through holes SIX and the upper surface of the insulating layer 51 near the through holes 51X. The electrolytic copper plating layer 103 is formed on the seed layer 102.

Next, an insulating layer 53 is formed on the insulating layer 51 in the same manner as the steps shown in FIG. 9A and FIG. 9B. The insulating layer 53 is formed with through holes 53X that expose parts of the upper surface of the wiring layer 52. Next, a wiring layer 54 including via wirings 55 and connection terminals P1 is formed, for example, by a semi-additive method in the same manner as the steps shown in FIG. 6B to FIG. 8B. The via wirings 55 is filled in the through holes 53X. The connection terminals P1 are electrically connected to the wiring layer 52 through the via wirings 55 and stacked on the upper surface 53A of the insulating layer 53. On this occasion, the wiring layer 54 includes a seed layer 104 and an electrolytic copper plating layer 105. The seed layer 104 covers the whole inner surfaces of the through holes 53X and the upper surface of the insulating layer 53 near the through holes 53X. The electrolytic copper plating layer 105 is formed on the seed layer 104. Also, the connection terminals P1 are formed into a substantially columnar shape. A surface treatment layer may be formed on the surfaces of each connection terminals P1 in accordance with necessity.

Figure 12:
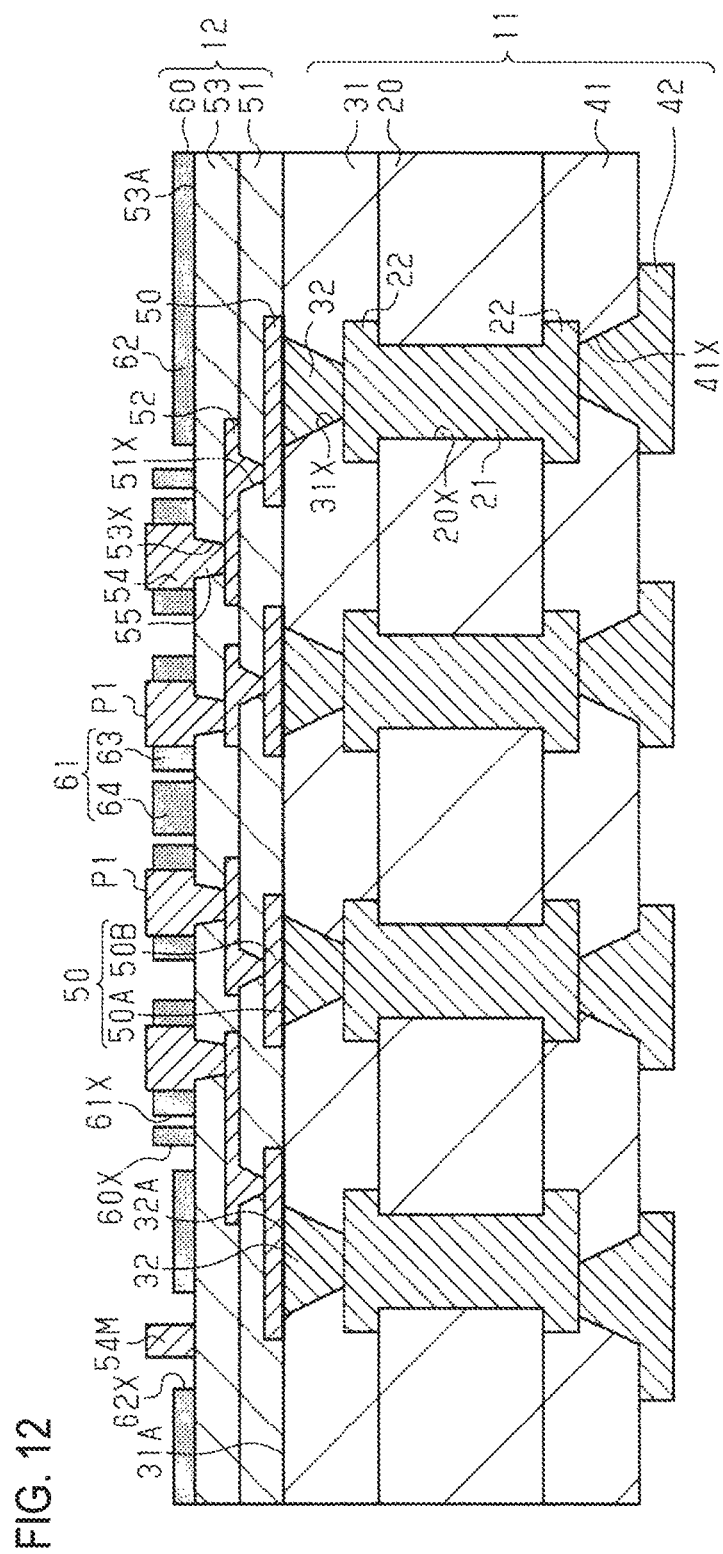
FIG. 12 is a schematic sectional view showing the method for manufacturing the wiring board according to the first exemplary embodiment.

Next, in a step shown in FIG. 12, a protection layer 60 including a protection layer 61 and a protection layer 62 is formed on the upper surface 53A of the insulating layer 53. An example of a method for forming the protection layer 60 will be described below.

in a step shown in FIG. 13A, a photosensitive resin layer 106 is formed on the upper surface 53A of the insulating layer 53 so as to cover the whole surfaces (side surfaces and upper surfaces) of the connection terminals P1 and the surface (side surface and upper surface) of the recognition mark 54M. The photosensitive resin layer 106 can be, for example, formed by application of varnish photosensitive resin by a spin coating method. On this occasion, the photosensitive resin layer 106 follows steps which are defined by the upper surface 53A of the insulating layer 53 and the connection terminals P1. Therefore, the photosensitive resin layer 106 rises up at positions above the steps defined by the connection terminals P1. In this exemplary embodiment, positive type photosensitive resin is used as a material of the photosensitive resin layer 106. However, negative type photosensitive resin may be used as the material of the photosensitive resin layer 106.

Next, in a step shown in FIG. 13B, a photomask 107 for patterning the photosensitive resin layer 106 to form the protection layer 60 is prepared. The photomask 107 includes light transmissive portions 107A and light shielding portions 107B. The photomask 107 is positioned above the photosensitive resin layer 106. For this positioning, the recognition mark 54M can be used as an alignment mark.

Subsequently, parts of the photosensitive resin layer 106 which are disposed in positions corresponding to opening portions 60X, 61X and 62X of the protection layer 60 are exposed to light through the light transmissive portions 107A of the photomask 107.

Next, in a step shown in FIG. 14A, the photosensitive resin layer 106 is developed. By this development, the parts of the photosensitive resin layer 106 which are irradiated with (exposed to) light having a predetermined wavelength are entirely removed. Thereby, the opening portions 60X, 61X and 62X which expose the upper surface 53A of the lower insulating layer 53 are formed. Also, in this step, the excess development is carried out to reduce the film thickness of parts of the photosensitive resin layer 106 which are not exposed to light. Thus, the parts of the photosensitive resin layer 106 which are not exposed to light are thinned. Thereby, parts of the connection terminals P1 on an upper end side thereof are exposed from the photosensitive resin layer 106. On this occasion, due to the difference in film thickness (see the broken line) which arises during the formation of the photosensitive resin layer 106, a difference in film thickness also arises in the photosensitive resin layer 106 after the excess development. Specifically, after the development, the photosensitive resin layer 106 disposed in the mounting region A1 (that is, the protection layer 61) is thicker than the photosensitive resin layer 106 disposed in the outer peripheral region A2 (that is, the protection layer 62). The excess development may be, for example, carried out by setting its development time to be longer than a typical development time.

By forming the opening portion 60X by the exposure and development steps described above, the protection layer 61 and the protection layer 62 are patterned. Also, by forming the opening portions 61X, the protection insulating layers 63, 64 are patterned in the protection layer 61. By forming the opening portion 62X, the recognition mark 54M is exposed from the protection layer 60.

After that, the photosensitive resin layer 60 is cured by heating treatment. Thereby, as shown in FIG. 14B, the protection layer 60 including the protection layers 61, 62 is formed on the upper surface 53A of the insulating layer 53.

By the manufacturing steps described above, the wiring structure 12 is stacked on the upper surface 31A of the insulating layer 31 which is the uppermost layer of the wiring structure 11, as shown in FIG. 15.

Next, in a step shown in FIG. 15, a solder resist layer 13 is stacked on the lower surface of the insulating layer 41. The solder resist layer 13 is formed with opening portions 13X. The opening portions 13X expose external connection pads P2 which are defined at predetermined positions on the lowermost wiring layer 42 of the wiring structure 11. For example, a photosensitive solder resist film is laminated or liquid solder resist is applied. Then, the laminated or applied resist is patterned into a predetermined shape. Thereby, the solder resist layer 13 can be formed.

A surface treatment layer may be formed on the wiring layer 42 (that is, the external connection pads P2) exposed from each opening portions 13X of the solder resist layer 13 in accordance with necessity.

By the manufacturing steps described above, the wiring board 10 according to this exemplary embodiment is manufactured.

Next, a method for manufacturing the semiconductor device 70 will be described.

Figure 16:
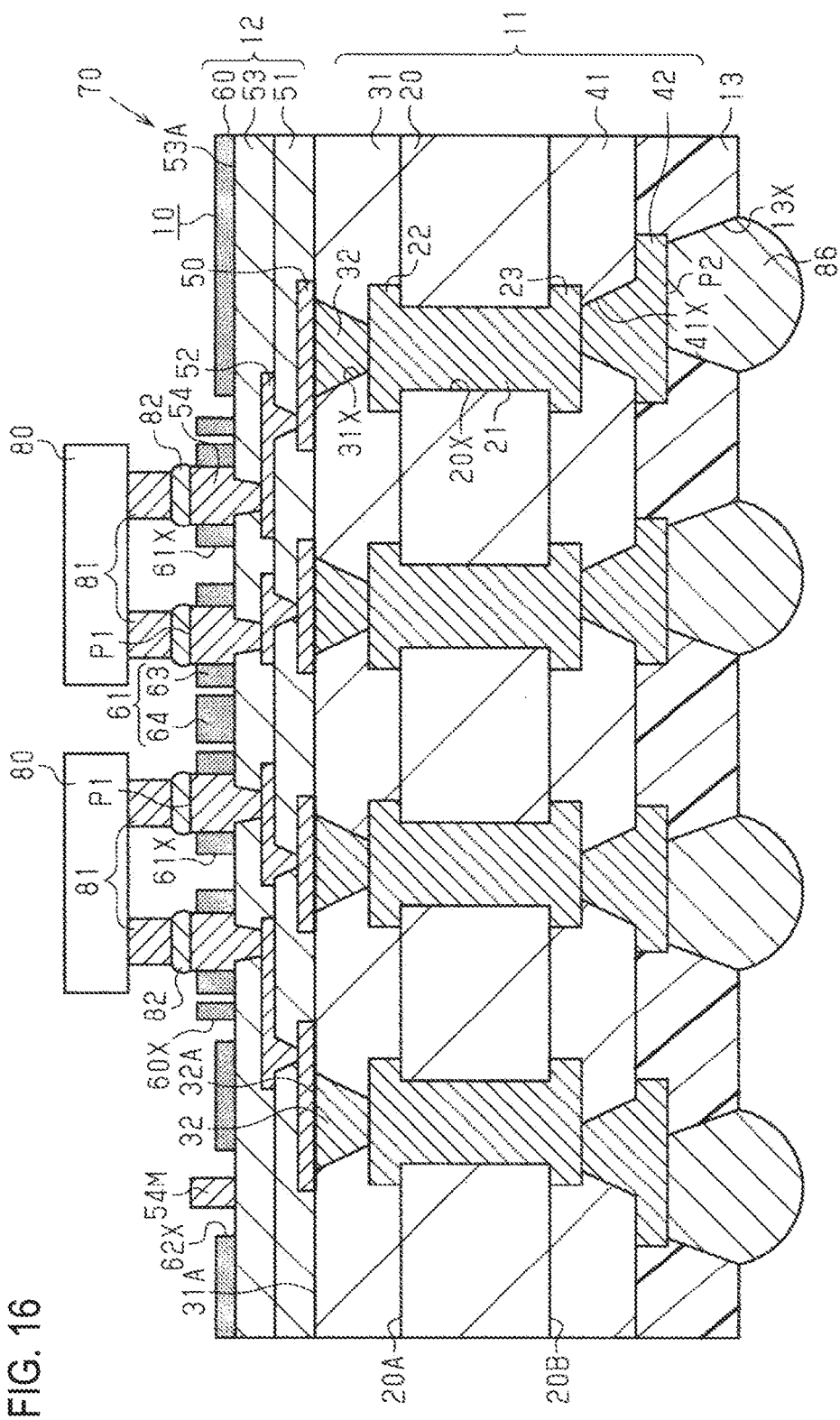
FIG. 16 is a schematic sectional view showing a method for manufacturing the semiconductor device according to the first exemplary embodiment.

In a step shown in FIG. 16, external connection terminals 86 are formed on the external connection pads P2. For example, flux is suitably applied onto the external connection pads P2. Then, the external connection terminals 86 (here, solder balls) are mounted on the external connection pads P2 and reflowed at a temperature of about 240° C. to about 260° C. The external connection terminals 86 are fixed. After that, the surfaces of the external connection terminals 86 are washed to remove the flux.

Also, in the step shown in FIG. 16, semiconductor chips 80 including columnar connection terminals 81 are prepared. The connection terminals 81 can be manufactured by a well-known manufacturing method. Therefore, the method is not depicted in FIG. 16, and detailed description will be omitted. For example, however, the connection terminals 81 are manufactured in the following method.

At first, for example, a protection film having opening portions for exposing electrode pads is formed in a circuit formation surface (here, a lower surface) of each semiconductor chip 80. A seed layer is formed to cover the lower surface of the protection film and the lower surfaces of the electrode pads. Next, a resist layer is formed to expose the seed layer (the seed layer covering the lower surfaces of the electrode pads) in portions corresponding to the regions where the connection terminals 81 will be formed. Next, an electrolytic plating method (for example, an electrolytic copper plating method) using the seed layer as a power feeding layer is carried out for the seed layer exposed from the resist layer. Thereby, the columnar connection terminals 81 are formed on the electrode pads.

Next, joining members 82 are formed on the lower surfaces of the connection terminals 81. The joining members 82 can be formed as follows. Solders are deposited on the lower surfaces of the connection terminals 81, for example, by an electrolytic solder plating method using the resist layer formed on the seed layer as a plating mask and using the seed layer as a power feeding layer. After that, the seed layer and the resist layer that are not necessary are removed.

Next, the connection terminals 81 of the semiconductor chips 80 are bonded onto the connection terminals P1 (the wiring layer 54) of the wiring board 10 in a flip-chip manner. For example, after the wiring board 10 and the semiconductor chips 80 are positioned with respect to each other, reflow treatment is carried out to melt the joining members 82 (solder plating layers) and electrically connect the connection terminals 81 to the connection terminals P1.

After that, underfill resin 85 (see FIG. 3) is filled between the semiconductor chips 80 and the wiring board 10, which are bonded to each other in the flip-chip manner. Then, the underfill resin 85 is cured. On this occasion, since the opening portions 61X is formed in the protection layer 61, a capillary phenomenon appears so remarkable that the filling property of the underfill resin 85 can be improved.

Figure 3:
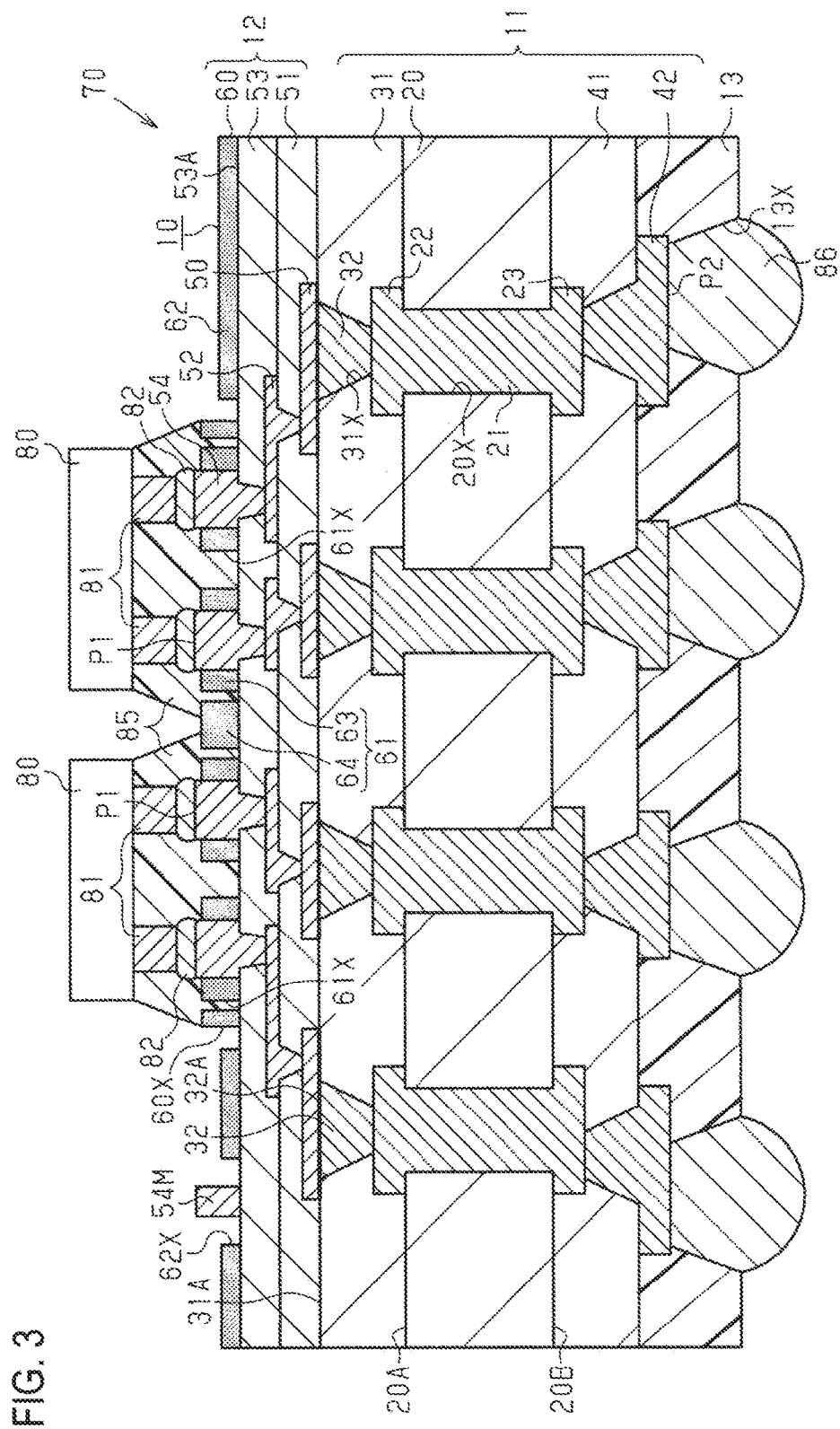
FIG. 3 is a schematic sectional view showing a semiconductor device according to the first exemplary embodiment.

By the above described manufacturing steps, the semiconductor device 70 shown in FIG. 3 is manufactured.

Result of Simulation

Next, a result of simulation to analyze a stress distribution in the semiconductor device 70 will be described.

First, description will be given on evaluation samples, that is, a model structure of an example shown in FIG. 17A and a model structure of a comparative example shown in FIG. 17B.

Figure 17A:
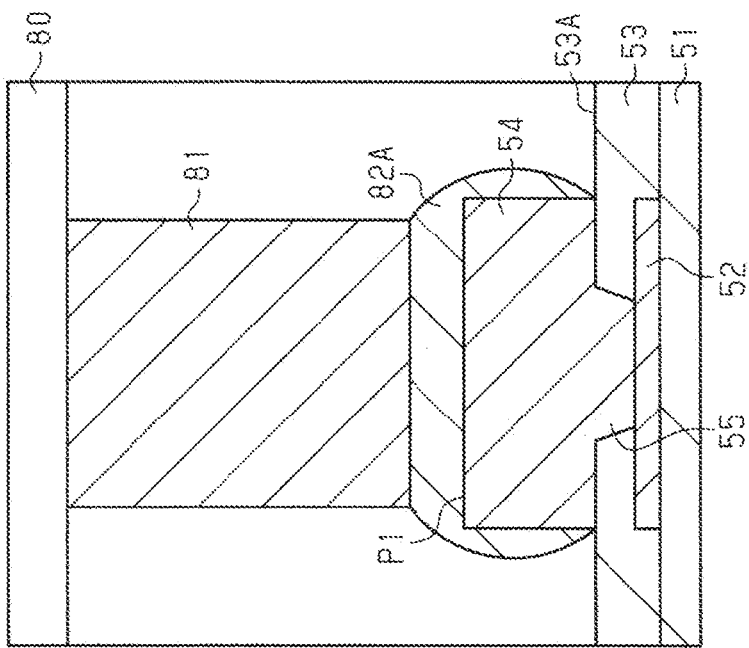
FIG. 17A is a schematic sectional view showing a model structure of an example.

As shown in FIG. 17A, the sample of the example had a structure similar to the semiconductor device 70 shown in FIG. 3 has. Simulation conditions were set so that the planar shape of the semiconductor chip 80 was 150 µm by 150 µm, the diameter of the lower end surface of the via wiring 55 was 10 µm, the diameter of the connection terminal P1 was 25 µm, the thickness of the connection terminal P1 was 10 µm, the diameter of the connection terminal 81 was 22 µm, and the thickness of the connection terminal 81 was 25 µm. The protection layer 60 (protection layer 61) was formed to cover the whole side surfaces of the connection terminal P1 in the sample of the example.

Figure 17B:
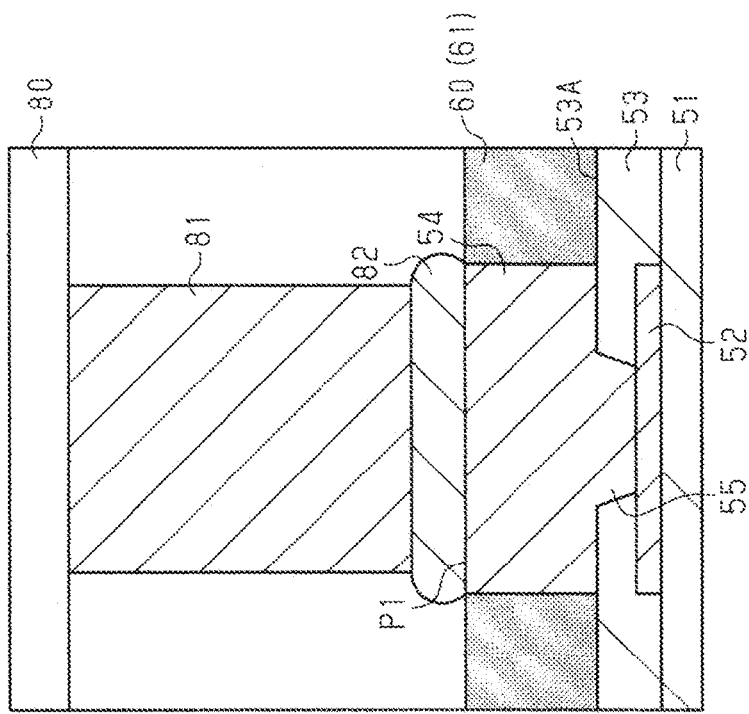
FIG. 17B is a schematic sectional view showing a model structure of a comparative example.

On the other hand, in the sample of the comparative example, as shown in FIG. 17B, the connection terminals P1 protruded upward from the upper surface 53A of the insulating layer 53, but the protection layer 60 was not formed on the upper surface 53A of the insulating layer 53. Therefore, in the sample of the comparative example, the side surfaces of the connection terminals P1 were covered with the joining members 82A. Simulation conditions were similar to those of the example, except that the protection layer 60 was not formed.

FIG. 18A shows a result of simulation to analyze a distribution of stress occurring in an interface between the connection terminal P1 and the photosensitive resin layer (the insulating layer 53 and the protection layer 60) in the sample of the example. On the other hand, FIG. 18B shows a result of simulation to analyze a distribution of stress occurring in an interface between the connection terminal P1 and the photosensitive resin layer (the insulating layer 53) in the sample of the comparative example.

In the sample of the comparative example, as shown in FIG. 18B, stress was concentrated just under a corner portion of the connection terminal P1, that is, in the interface between the lower surface of the connection terminal P1 and the upper surface of the insulating layer 53. The stress generated in the interface between the connection terminal P1 and the insulating layer 53 in the comparative example was about 146.0 MPa. To the contrary, in the sample of the example, as shown in FIG. 18A, stress generated in the interface between the connection terminal P1 and the photosensitive resin layer was dispersed. Thereby, in the sample of the example, the stress concentrated in the interface between the lower surface of the connection terminal P1 and the upper surface of the insulating layer 53 was reduced. Specifically, the stress generated in the interface between the connection terminal P1 and the insulating layer 53 in the sample of the example was about 100.2 MPa, which is much lower than that in the sample of the comparative example.

As described above, it is confirmed that stress concentrated at one place in the interface between the connection terminal P1 and the photosensitive resin layer was reduced by the protection layer 60 (photosensitive resin layer) formed to surround the connection terminal P1. It is, therefore, possible to suitably suppress cracks from occurring in the interface between the connection terminal P1 and the photosensitive resin layer.

According to the exemplary embodiment described above, the following advantages can be obtained.

(1) The protection layer 60 (the protection insulating layer 63 of the protection layer 61) is formed to be in contact with the side surfaces of the columnar connection terminals P1 and to surround the connection terminal P1. Thereby, the interface between the connection terminals P1 and the photosensitive resin layer (the protection layer 60 and the insulating layer 53) can be increased, so that the stress generated in the interface between the connection terminals P1 and the photosensitive resin layer can be dispersed. Thus, the stress concentrated at one place in the interface between the connection terminals P1 and the photosensitive resin layer can be reduced. As a result, it is possible to suitably suppress cracks from occurring in the interface between the connection terminals P1 and the photosensitive resin layer.

(2) The protection layers 61, 62 are formed to be separated from each other by the opening portion 60X. It is, therefore, possible to suitably suppress the underfill resin 85 from spread to outside of the mounting region A1. That is, the protection layer 62 formed outside the opening portion 60X serves as a dam that blocks the underfill resin 85. Also, since the protection layers 61, 62 are separated from each other by the opening portion 60X, warpage caused by thermal shrinkage of resin can be reduced.

(3) The protection layer 61 is formed to be thicker than the protection layer 62. Thus, warpage of the wiring board 10 can be suppressed as compared with the case where the protection layers 61, 62 are formed to have almost the same thickness.

Figures 19, 20:
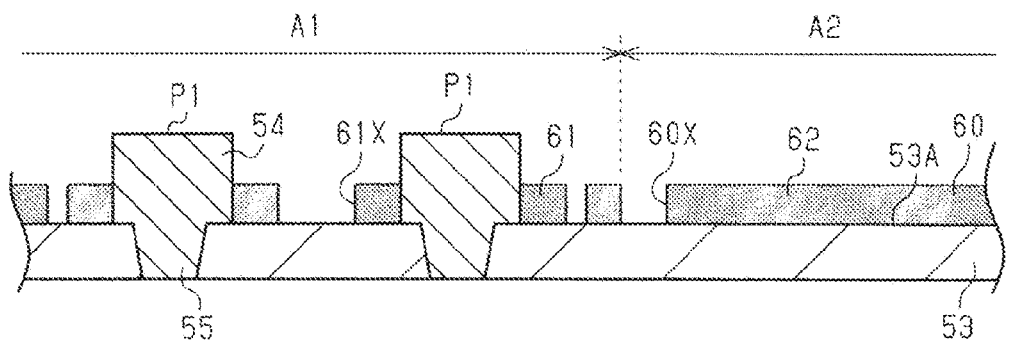
FIG. 19 is a schematic sectional view showing a protection layer of the comparative example.
FIG. 20 is an explanatory view showing a simulation result of warpage.

Detailed description in this matter will be given below. In the case of a comparative example where the protection layers 61, 62 are formed to have almost the same thickness, the wiring structure 12 side tends to warp to form a recess shape. This is because the wiring density in the outer peripheral region A2 is lower than that in the mounting region A1 and because the thermal expansion coefficient (for example, about 50 ppm/° C. to about 70 ppm/° C.) of the protection layer 60 (photosensitive resin layer) is higher than that (for example, about 17 ppm/° C.) of the connection terminals P1 (copper layer). In particular, when the protection layers 61, 62 are formed have almost the same thickness, an amount of the photosensitive resin in the outer peripheral region A2 exceeds that of the photosensitive resin in the mounting region A1. Thus, thermal shrinkage in the outer peripheral region A2 becomes larger than that in the mounting region A1. Accordingly, the outer peripheral region A2 warps toward the mounting region A1, which causes recessed warpage on the wiring structure 12 side. On the other hand, according to the exemplary embodiment, the protection layer 61 in the mounting region A1 is formed to be thicker than the protection layer 62 in the outer peripheral region A2. Thereby, the difference between the amount of the photosensitive resin in the mounting region A1 and the amount of the photosensitive resin in the outer peripheral region A2 is reduced. As a result, warpage of the wiring board 10 can be suppressed, as compared with the case where the protection layers 61, 62 are formed to have almost the same thickness. FIG. 20 shows evaluation results showing this advantage.

FIG. 20 shows a result of simulation of warpage carried out for the wiring board 10 (example) shown in FIG. 1A. Specifically, the planar shape of the wiring board 10 was set to be a square of 40 mm by 40 mm, and the planar shape of the mounting region A1 was set to be a rectangle of 20 mm by 10 mm. Also, the thickness of the core substrate 20 was set to be 800 μm, the thickness of the wiring layers 22, 23 in the wiring structure 11 was set to be 25 μm, the thickness of the wiring layer 42 was set to be 15 μm, the thickness of the insulating layers 31, 41 in the wiring structure 11 was set to be 40 μm, and the thickness of the solder resist layer 13 was set to be 20 μm. Furthermore, the thickness of the wiring layers 50, 52 in the wiring structure 12 was set to be 2.5 μm, the thickness of the connection terminals P1 was set to be 10 μm, and the thickness of the insulating layers 51, 53 in the wiring structure 12 was set to be 5 μm. Then, in the wiring board 10 thus configured, the simulation of warpage was carried out for the case where an assumption that the thickness of the protection layer 61 was 5 μm and that the thickness of the protection layer 62 was 3 μm. As a comparative example, the simulation of warpage was also executed for the case where the protection layers 61, 62 had almost the same thickness in the same manner as in the wiring board shown in FIG. 19, specifically in the case where the thickness of the protection layer 61 was 3 μm and the thickness of the protection layer 62 was 3 μm.

As is apparent from the result of the simulation shown in FIG. 20, it is proved that when the protection layer 61 is thicker than the protection layer 62, the amount of warpage in the wiring board 10 can be reduced, as compared with the comparative example in which the protection layers 61, 62 have the same thickness. The "amount of warpage" is defined as, for example, a difference between the highest level on a certain surface in the wiring substrate 10 and the lowest level on the surface in the wiring substrate when the wiring substrate 10 is kept at a room temperature.

(4) The protection insulating layers 64 are patterned between adjacent ones of the protection insulating layers 63. In other words, the opening portions 61X are formed between the protection insulating layers 63 and the protection insulating layers 64 so as to surround the protection insulating layers 63. Since the opening portions 61X is formed, the capillary phenomenon appears remarkable when the underfill resin 85 is filled between the wiring board 10 and each semiconductor chips 80. Thus, the filling property of the underfill resin 85 can be improved.

(5) Also, the protection insulating layers 64 remains between adjacent ones of the protection insulating layers 63. Therefore, a gap between adjacent ones of connection terminals does not have to be entirely filled with the underfill resin 85 as in related art. That is, an area to be filled with the underfill resin 85 can be reduced, as compared with that in the related art. Thus, occurrence of voids or the like in the underfill resin 85 can be suitably suppressed. Furthermore, since the protection insulating layers 64 is formed, the capillary phenomenon appears more remarkable. It is, therefore, possible to improve the filling property of the underfill resin 85.

(6) Furthermore, since the protection insulating layers 64 are formed, the contact area between the protection layer 61 and the underfill resin 85 can be increased. Also, the protection insulating layers 64 are wedged into the underfill resin 85. Thus, a great anchor effect can be obtained, so that the adhesion between the protection layer 61 and the underfill resin 85 can be improved.

Second Exemplary Embodiment

A second exemplary embodiment will be described below with reference to FIG. 21. A wiring board 10A according to this exemplary embodiment is different from that according to the first exemplary embodiment in that the wiring structure 11 is replaced by a wiring structure 11A. Description will be given below mainly on the differences from the first exemplary embodiment. Members that are the same as the members shown in FIGS. 1A to 20 are given the same reference signs, and detailed description thereon will be omitted.

Figure 21:
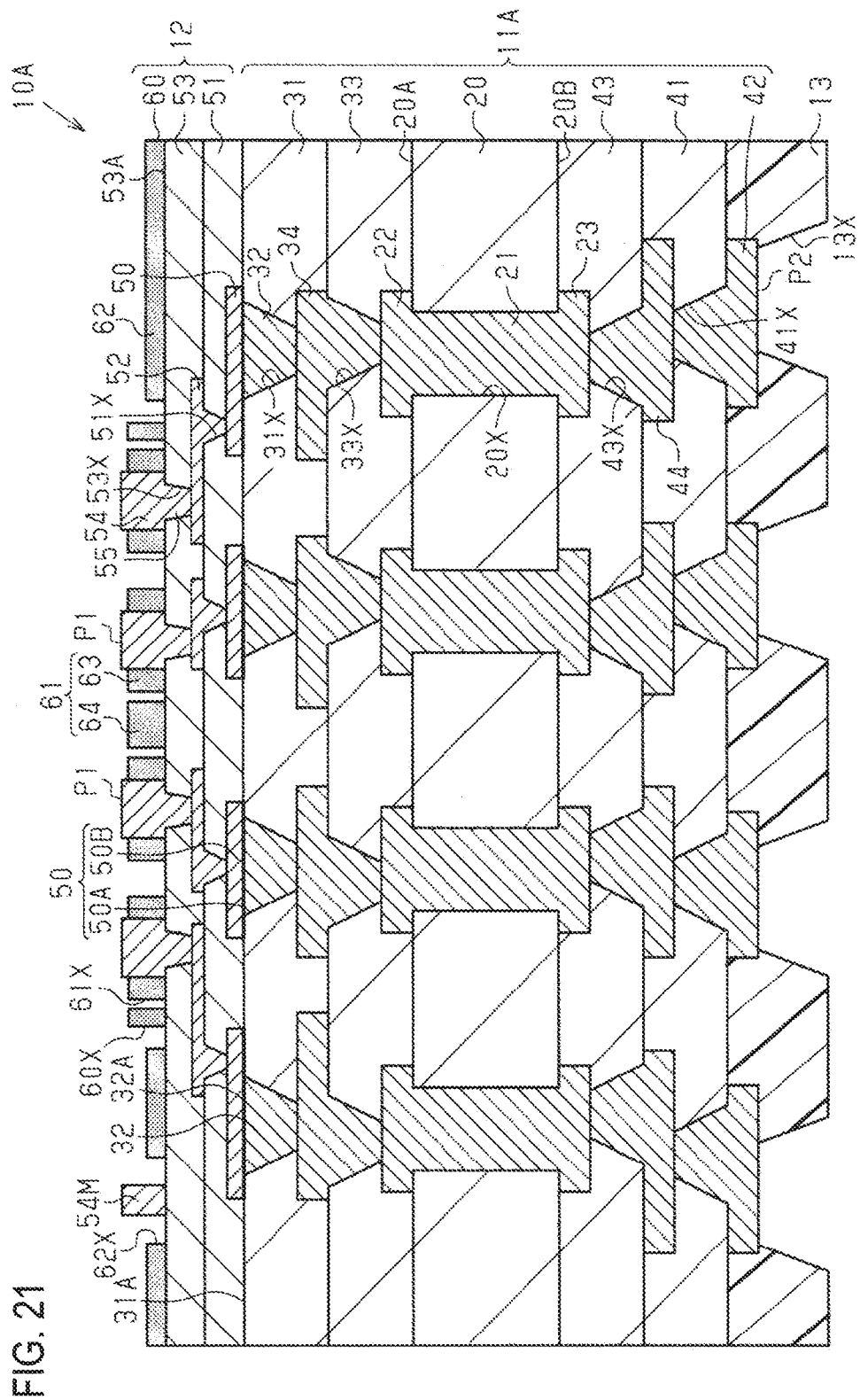
FIG. 21 is a schematic sectional view showing a wiring board according to a second exemplary embodiment.

As shown in FIG. 21, the wiring board 10A includes a wiring structure 11A, a wiring structure 12 and a solder resist layer 13. The wiring structure 12 is stacked on an upper side of the wiring structure 11A. The solder resist layer 13 is stacked on a lower side of the wiring structure 11A.

The wiring structure 11A is a low density wiring layer. Wiring layers in the wiring structure 11A is lower in wiring density than those in the wiring structure 12. An insulating layer 33, a wiring layer 34, an insulating layer 31, and via wirings 32 are stacked sequentially on an upper surface 20A of a core substrate 20. The insulating layer 33 covers a wiring layer 22. An insulating layer 43, a wiring layer 44, an insulating layer 41, and a wiring layer 42 are stacked sequentially on a lower surface 20B of the core substrate 20. The insulating layer 43 covers a wiring layer 23

Non-photosensitive insulating resin which contains thermosetting resin such as epoxy resin or polyimide resin as a main component may be used as materials of the insulating layers 33, 31, 43, 41. The insulating layers 33, 31, 43, 41 may contain filler such as silica or alumina. For example, copper or a copper alloy may be used as materials of the wiring layers 34, 44, 42 and the via wirings 32. Also, the insulating layers 33, 31, 43, 41 may be, for example, in a range of about 20 μm to about 45 μm in thickness. The wiring layers 34, 44, 42 may be, for example, in a range of about 15 μm to about 35 μm in thickness. A line and space (L/S) of the wiring layers 34, 44, 42 may be, for example, about 20 μm/20 μm.

Through holes 33X are formed at predetermined positions in the insulating layer 33. The through holes 33X pass through the insulating layer 33 in the thickness direction and partially expose an upper surface of the wiring layer 22.

Through holes 31X are formed in predetermined positions in the insulating layer 31. The through holes 31X pass through the insulating layer 31. in the thickness direction and partially expose an upper surface of the wiring layer 34. The through holes 33X, 31X are formed into a tapered shape whose diameter increases from the lower side (core substrate 20 side) thereof toward the upper side (wiring structure 12 side) thereof in FIG. 21. The wiring layer 34 includes via wirings. The via wirings are filled in the through holes 33X and are electrically connected to the wiring layer 22. The via wirings 32 are filled in the through holes 31X and electrically connected to the wiring layer 34. The wiring structure 12 is stacked on an upper surface 31A of the insulating layer 31 and upper end surfaces 32A of the via wirings 32.

On the other hand, through holes 43X are formed at predetermined positions in the insulating layer 43. The through holes 43X pass through the insulating layer 43 in the thickness direction and partially expose a lower surface of the wiring layer 23. Through holes 41X are formed at predetermined positions in the insulating layer 41. The through holes 41X pass through the insulating layer 41 in the thickness direction and partially expose a lower surface of the wiring layer 44. The through holes 43X, 41X are formed into a tapered shape whose diameter increases from the upper side (core substrate 20 side) thereof toward the lower side (solder resist layer 13 side) thereof in FIG. 21. The wiring layer 44 includes via wirings filled in the through holes 43X and electrically connected to the wiring layer 23. The wiring layer 42 includes via wirings filled in the through holes 41X and electrically connected to the wiring layer 44.

Even if the plural insulating layers and the plural wiring layers are stacked on the respective upper and lower opposite surfaces of the core substrate 20, similar advantageous effects to the advantageous effects (1) to (6) in the first exemplary embodiment can be obtained.

In this exemplary embodiment, the wiring structure 11A is an example of a first wiring structure; the wiring layer 34 is an example of a second wiring layer; the insulating layer 31 is an example of a second insulating layer; and each via wiring 32 is an example of a second via wiring.

Third Exemplary Embodiment

A third exemplary embodiment will be described below with reference to FIG. 22. A wiring board 10B according to this exemplary embodiment is different from that according to the first exemplary embodiment in that the wiring structure 11 is replaced by a wiring structure 11B and that the wiring structure 12 is replaced by a wiring structure 12B. Description will be given below mainly on differences from the first exemplary embodiment. Members which are the same as those shown in FIGS. 1A to 21 will be given the same reference signs, and detailed description thereon will be omitted.

Figure 22:
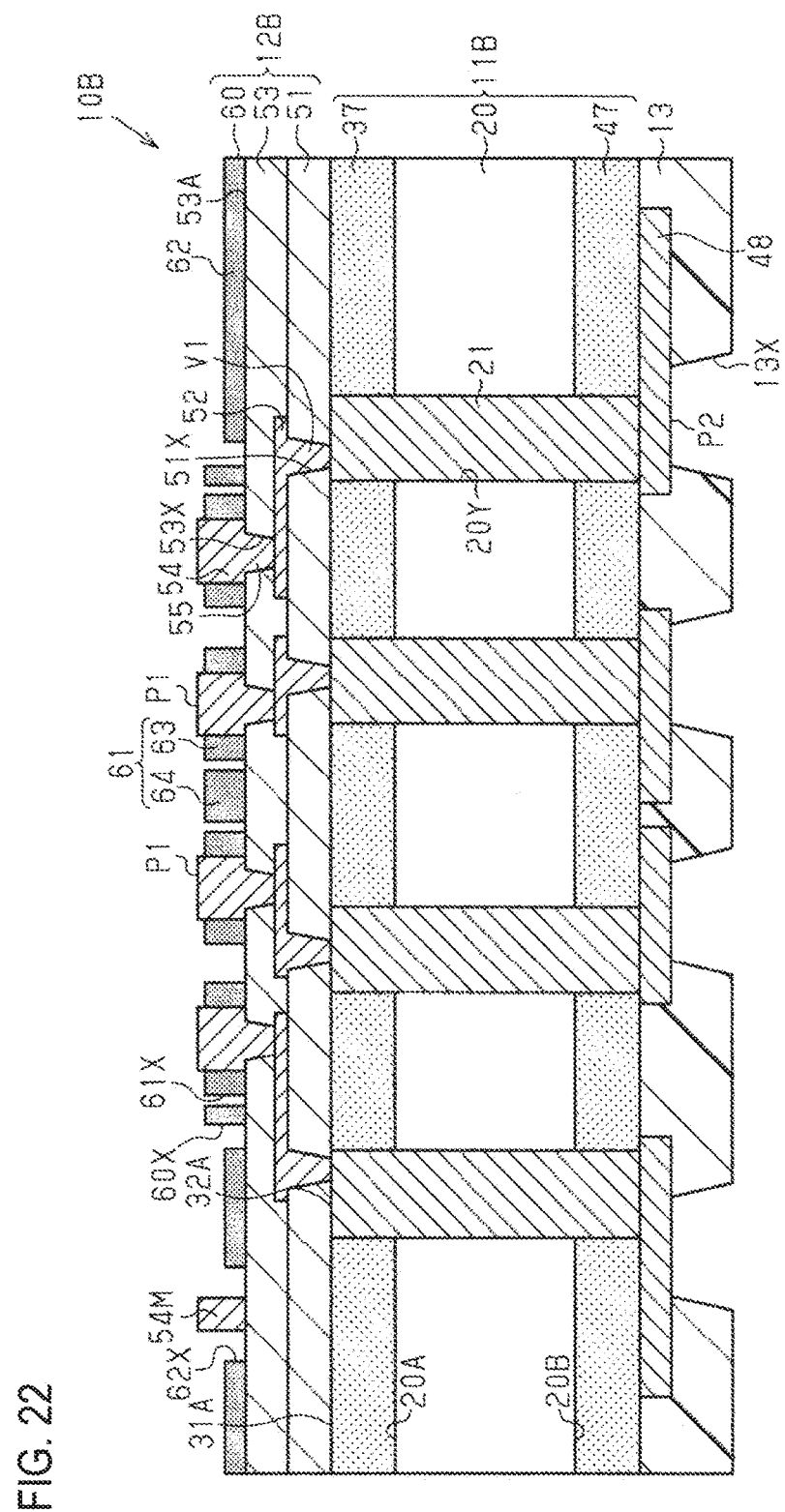
FIG. 22 is a schematic sectional view showing a wiring board according to a third exemplary embodiment.

As shown in FIG. 22, the wiring board 10B includes a wiring structure 11B, a wiring structure 12B and a solder resist layer 13. The wiring structure 12B is stacked on an upper side of the wiring structure 11B. The solder resist layer 13 is stacked on a lower side of the wiring structure 11B.

The wiring structure 11B is a wiring structure that does not have a stack structure in which insulating layers and wiring layers are stacked. The wiring structure 11B is a low density wiring layer. Wiring layers in the wiring structure 11B are lower in wiring density than those in the wiring structure 12B. In the wiring structure 11B, only an insulating layer 37 is stacked on an upper surface 20A of a core substrate 20. Also, an insulating layer 47 and a wiring layer 48 are stacked on a lower substrate 2013 of the core substrate 20. Non-photosensitive insulating resin which contains thermosetting resin such as epoxy resin or polyimide resin as a main component may be used as materials of the insulating layers 37, 47. The insulating layers 37, 47 may contain filler such as silica or alumina. For example, copper or a copper alloy may be used as a material of the wiring layer 48. Also, the insulating layers 37, 47 may be, for example, in a range of about 20 µm to about 45 µm in thickness. The wiring layer 48 may be, for example, in a range of about 15 µm to about 35 µm in thickness.

Through holes 20Y are formed in the core substrate 20, the insulating layer 37 and the insulating layer 47. The through holes 20Y pass through the core substrate 20, the insulating layer 37 and the insulating layer 47 in the thickness direction. Through electrodes 21 are formed in the through holes 20Y. The through holes 21 are, for example, formed to fill the through holes 20Y. Upper end surfaces of the through electrodes 21 are exposed from an upper surface of the insulating layer 37. Lower end surfaces of the through electrodes 21 are exposed from a lower surface of the insulating layer 47. For example, the upper end surfaces of the through electrodes 21 are substantially flush with the upper surface of the insulating layer 37. Also, for example, the lower end surfaces of the through electrodes 21 are substantially flush with the lower surface of the insulating layer 47. The upper end surfaces of the through electrodes 21 are directly joined to via wirings V1 provided for a wiring layer 52 of the wiring structure 12B. The lower end surfaces of the through electrodes 21 are directly joined to the wiring layer 48.

The wiring structure 12B does not have a wiring layer 50 but the lower end surfaces of the via wirings V1 are directly joined to the upper end surfaces of the through electrodes 21. The insulating layer 51 covers the whole upper surface of the insulating layer 37 exposed from the via wirings V1.

The solder resist layer 13 is formed on the lower surface of the insulating resin layer 47 so as to cover the lowermost wiring layer 48. Opening portions 13X are formed in the solder resist layer 13. The opening portions 13X expose parts of the lowermost wiring layer 38 as external connection pads P2.

Even through the wiring structure 11B does not have a stack structure in which plural insulating layers and plural wiring layers are stacked, similar advantageous effects to the advantageous effects (1) to (6) in the first exemplary embodiment can be obtained.

Fourth Exemplary Embodiment

A fourth exemplary embodiment will be described below with reference to FIG. 23. A wiring board 10C according to this exemplary embodiment is different from that according to the first exemplary embodiment in that the wiring structure 11 is replaced by a wiring structure 11C. Description will be given below mainly on differences from the first exemplary embodiment. Members which are the same as those shown in FIGS. 1 to 22 are given the same reference signs, and detailed description thereon will be omitted.

Figure 23:
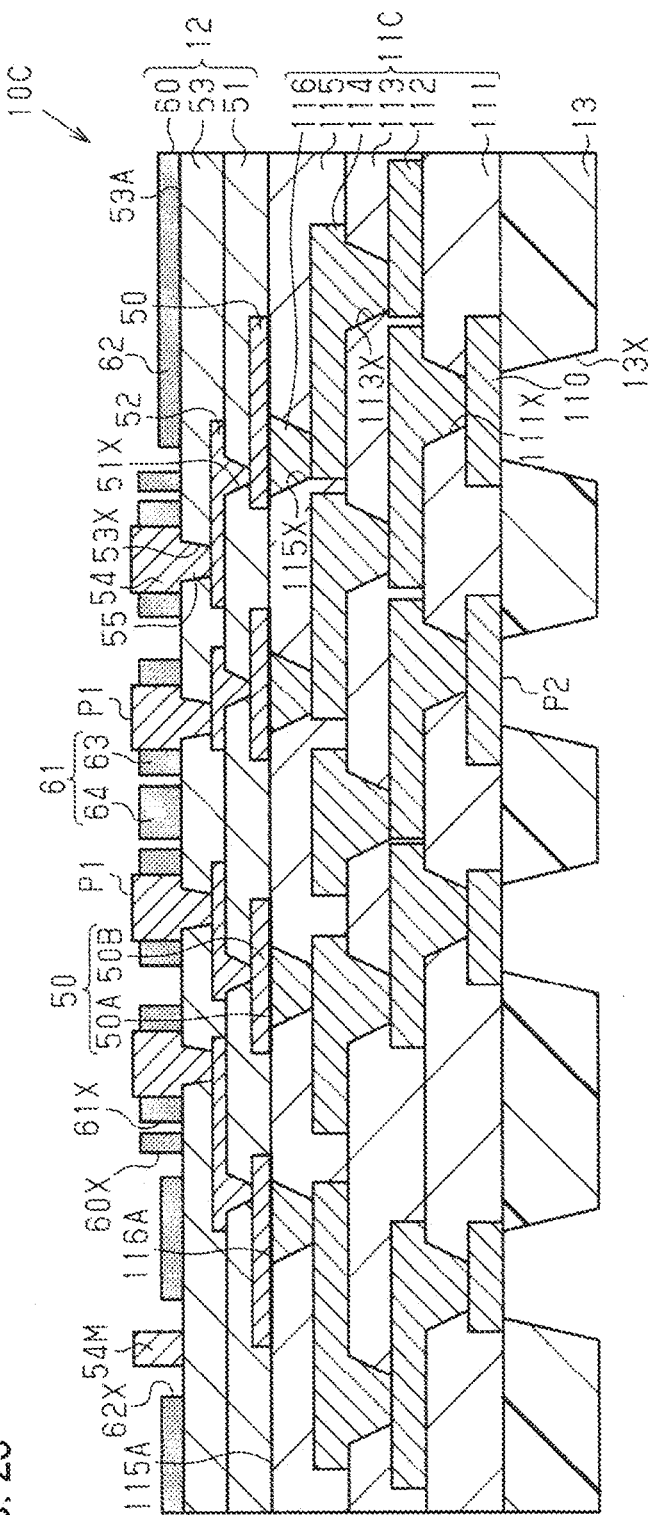
FIG. 23 is a schematic sectional view showing a wiring board according to a fourth exemplary embodiment.

As shown in FIG. 23, the wiring structure 11C is a wiring structure that does not have a core substrate 20. The wiring structure 11C is a low density wiring layer. Wiring layers in the wiring structure 11C are lower in wiring density than those in the wiring structure 12. The wiring structure 11C has a structure in which a wiring layer 110, an insulating layer 111, a wiring layer 112, an insulating layer 113, a wiring layer 114, an insulating layer 115, and via wirings 116 are stacked sequentially. Non-photosensitive insulating resin which contains thermosetting resin such as epoxy resin or polyimide resin as a main component may be used as materials of the insulating layers 111, 113, 115. The insulating layers 111, 113, 115 may contain filler such as silica or alumina. Also the insulating layers 111, 113, 115 may contain a reinforcing material. For example, copper or a copper alloy may be used as materials of the wiring layers 112, 114 and the via wirings 116. Furthermore, the insulating layers 111, 113, 115 may be, for example, in a range of about 20 µm to about 45 µm in thickness. The wiring layers 110, 112, 114 may be, for example, in a range of about 15 µm to about 35 µm in thickness. A line and space (L/S) of each wiring layer 110, 112, 114 may be, for example, about 20 µm by 20 µm.

The wiring layer 110 is the lowermost wiring layer of the wiring structure 11C. For example, a lower surface of the wiring layer 110 is exposed from the insulating layer 111. The lower surface of the wiring layer 110 is, for example, substantially flush with a lower surface of the insulating layer 111. For example, a structure in which a first conductive layer (for example, a Cu layer) and a second conductive layer (for example, a Ni layer/Au layer) are stacked is used as the wiring layer 110. In this case, the wiring layer 110 is formed so that the Au layer is exposed from the insulating layer 111.

The insulating layer 111 covers the upper surface and the side surface of the wiring layer 110 and expose the lower surface of the wiring layer 110. Through holes 111X are formed at predetermined positions in the insulating layer 111. The through holes 111X pass through the insulating layer 111 in the thickness direction and partially expose the upper surface of the wiring layer 110.

The wiring layer 112 is stacked on an upper surface of the insulating layer 111. The wiring layer 112 includes via wirings and a wiring pattern. The via wirings are filled in the through holes 111X. The wiring pattern is electrically connected to the wiring layer 110 through the via wirings. The wiring pattern is stacked on an upper surface of the insulating layer 111.

The insulating layer 113 is formed on the upper surface of the insulating layer 111 so as to cover the wiring layer 112. Through holes 113X are formed at predetermined positions in the insulating layer 113. The through holes 113X pass through the insulating layer 113 in the thickness direction. The through holes 113X partially expose the upper surface of the wiring layer 112.

The wiring layer 114 is stacked on an upper surface of the insulating layer 113. The wiring layer 114 includes via wirings and a wiring pattern. The via wirings are filled in the through holes 113X. The wiring pattern is electrically connected to the wiring layer 112 through the via wirings. The wiring pattern is stacked on the upper surface of the insulating layer 113.

The insulating layer 115 is formed on an upper surface of the insulating layer 113 so as to cover the wiring layer 114. Through holes 115X are formed at predetermined positions in the insulating layer 115. The through holes 115X pass through the insulating layer 115 in the thickness direction. The through holes 115X partially expose an upper surface of the wiring layer 114.

Here, the through hole 111X, 113X, 115X are formed into a tapered shape whose diameter increases from the lower side (solder resist layer 13 side) thereof toward the upper side (wiring structure 12 side) thereof in FIG. 23. That is, all the through holes 111X, 113X, 115X formed in the wiring structure 11C are formed into tapered shapes in which opening portions on the wiring structure 12 side thereof are larger than opening portions on the solder resist layer 13 side thereof. Opening diameters of the upper opening end of the through holes 111X, 113X, 115X may be, for example, in a range of about 60 μm to about 70 μm.

Via wirings 116 are formed in the through holes 115X. The via wirings 116 electrically connect the wiring layer 114 with a wiring layer 50 formed on an upper surface 115A of the insulating layer 115. The via wirings 116 are, for example, filled in the through holes 115X. Therefore, the via wirings 116 are formed into similar shapes to those of the through holes 115X. Upper end surfaces 116A of the via wirings 116 are, for example, substantially flush with the upper surface 115A of the insulating layer 115.

The wiring structure 12 is stacked on the upper surface 115A of the insulating layer 115 and the upper end surfaces 116A of the via wirings 116. For example, the wiring layer 50 of the wiring structure 12 is stacked on the upper surface 115A of the insulating layer 115 so as to be connected to the upper end surfaces 1164 of the via wirings 116. Here, the upper surface 115A of the insulating layer 115 and the upper end surfaces 116A of the via wirings 116 may be, for example, polished surfaces like the upper surface 31A of the insulating layer 31 and the upper end surfaces 32A of the via wirings 32 in the first exemplary embodiment (see FIG. 1A).

On the other hand, the solder resist layer 13 is formed on the lower surface of the insulating layer 111 so as to cover the lowermost wiring layer 110. Opening portions 13X are formed in the solder resist layer 13. The opening portions 13X expose parts of the lowermost wiring layer 110 as external connection pads P2.

Even through the wiring structure 11C does not have a core substrate 20 as described above, similar advantageous effects to the advantageous effects (1) to (6) in the first exemplary embodiment can be obtained.

In this exemplary embodiment, the wiring structure 11C is an example of a first wiring structure; the wiring layer 114 is an example of a second wiring layer; the insulating layer 115 is an example of a second insulating layer; and the via wirings 116 are an example of a second via wiring.

Other Exemplary Embodiments

The exemplary embodiments may be changed suitably and carried out in the following manners.

Figure 24:
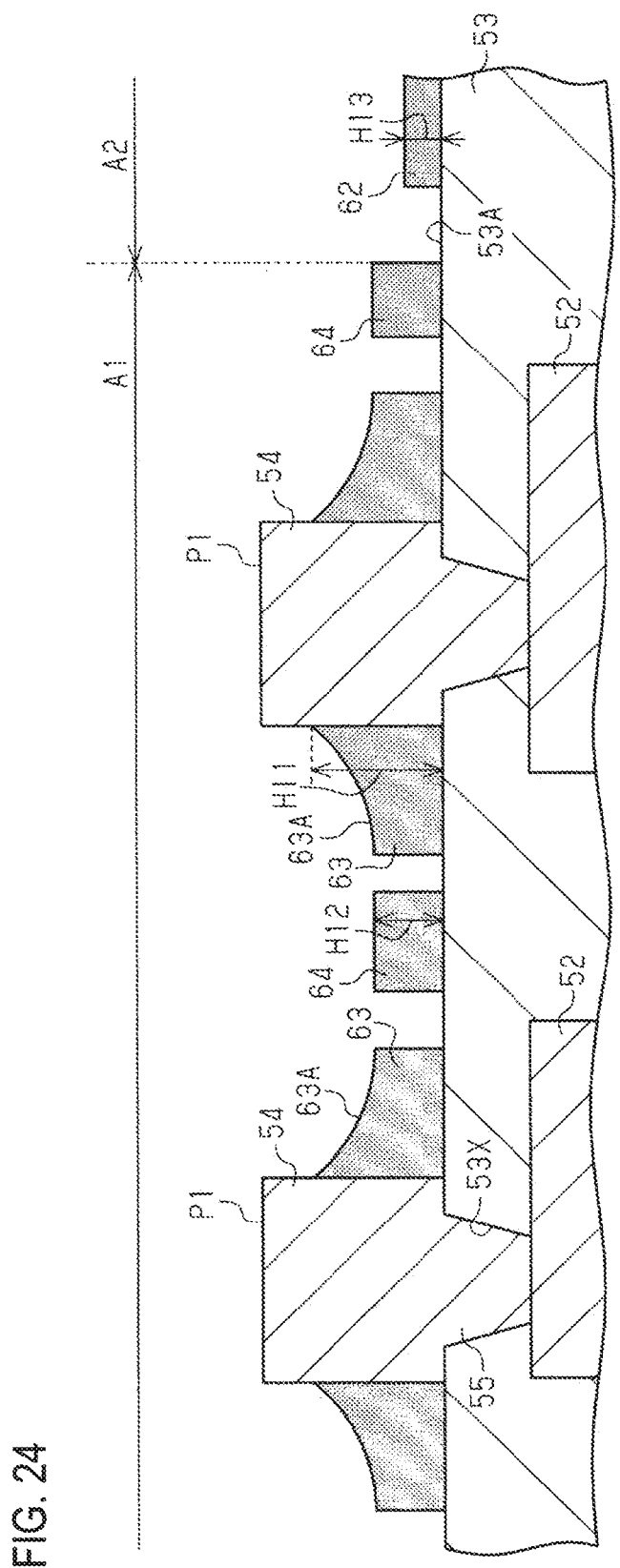
FIG. 24 is an enlarged sectional view showing a part of a wiring board according to a modification example.

As shown in FIG. 24, a curved portion 63A may be formed on the upper surface of each protection insulating layer 63. The curved portions 63A are curved and recessed from the side-surface sides of the connection terminals P1 toward a direction away from the connection terminals P1.

Figure 26:
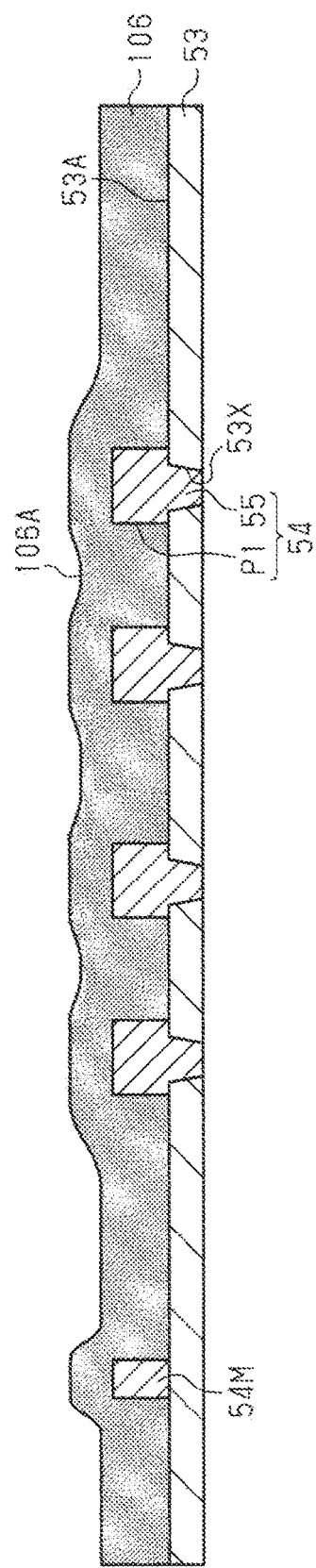
FIG. 26 is an enlarged sectional view showing a part of a wiring board according to another exemplary embodiment.

The curved portions 63A may be formed by the following manner. In the above-described step shown in FIG. 13A, the photosensitive resin layer 106 is, for example, formed by applying the varnish photosensitive resin by the spin coating method. In this case, because of steps defined by adjacent connection terminals P1 and a portion of the upper surface 53A of the insulating layer 53 between the adjacent connection terminals, a recess portion 106A is formed on an upper surface of the photosensitive resin layer 106 as shown in FIG. 26. The recess portion 106A is recessed from the upper surface of the photosensitive resin layer 106 toward the upper surface 53A of the insulating layer 53. Next, the photosensitive resin layer 106 is processed by the exposure and the excess development. Similarly to the above-described step in FIG. 14A, due to the differences in film thickness which arise during the formation of the photosensitive resin layer 106, differences in film thickness also arise in the photosensitive resin layer 106 after the excess development. As a result, the curved portion 63A is formed as shown in FIG. 24.

The curved portions 63A enhance fluidity of the underfill resin 85 (see FIG. 3). Hence, the filling property of the underfill resin 85 is improved. In this case, a thickness H12 of the protection insulating layers 64 is thinner than a thickness H11 of the closest portions of the protection insulating layers 63 to the side surfaces of the connection terminals P1. Also, a thickness H13 of the protection layer 62 is thinner than the thickness H12 of the protection insulating layers 64. In other words, the upper surfaces of the protection insulating layers 64 are lower than the top portions (upper ends) of the protection insulating layers 63 which are the closest portions of the protection insulating layers 63 to the side surfaces of the connection terminals P1. Furthermore, the upper surface of the protection layer 62 is lower than the upper surfaces of the protection insulating layers 64. Although the curved portions 63A are formed all over the upper surfaces of the protection insulating layers 63 in the illustrated example, the curved portions 63A may be formed only a pail of the upper surfaces of the protection insulating layers 63. Also, a curved portion that is curved and recessed may be formed on the upper surface of each protection insulating layer 64 in the same manner as the curved portion 63A.

Figure 25:
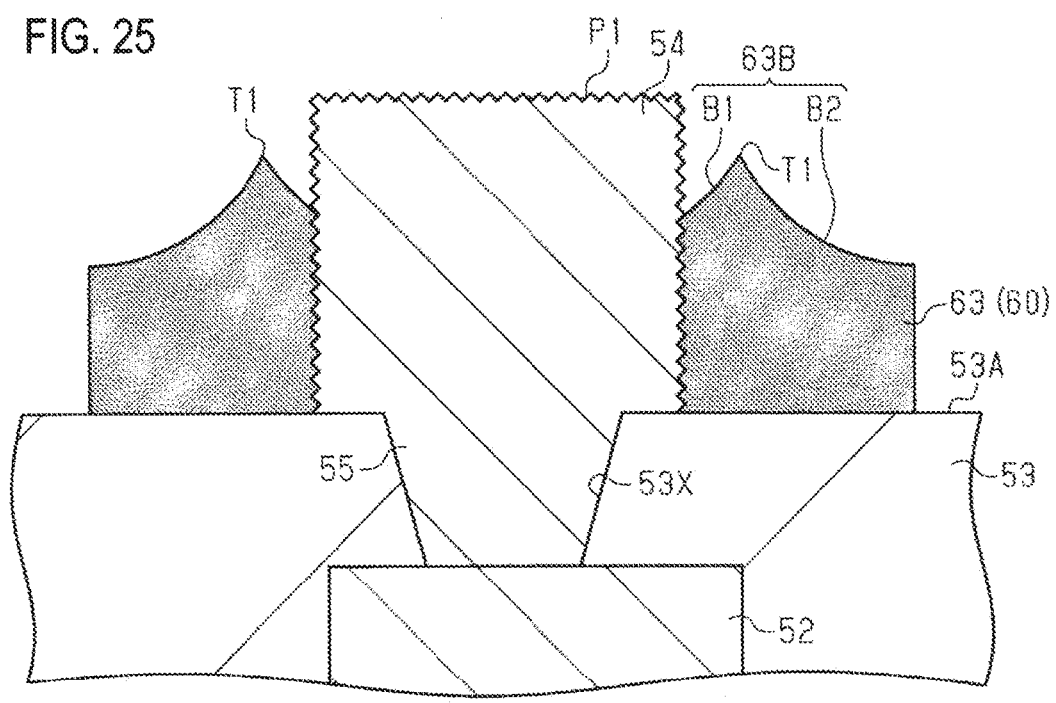
FIG. 25 is an enlarged sectional view showing a part of a wiring board according to another modification example.

As shown in FIG. 25, the upper and side surfaces of the connection terminals P1 may be roughened surfaces. For example, the surface roughness of the upper and side surfaces of the connection terminals P may be larger than that of the wiring layer 52. The surface roughness (Ra value) of the upper and side surfaces of the connection terminal P may be in a range of about 0.2 μm to about 1.0 μm. Thus, the adhesion between the connection terminal P1 and the protection layer 60 can be improved.

The upper and side surfaces of the connection terminals P1 may be roughened in the following manner. The exposed surfaces of the wiring layer 54 (connection terminals P1) shown in FIGS. 10 and 11 may be roughened by wet etching. In this case, etchant of the wet etching may be formic acid.

As shown in FIG. 25, arising portions 63B rising upward may be formed on the upper surface of each protection insulating layers 63. A top portion T1 (upper end portion) of the rising portion 63B has, for example, a needle-like shape in sectional view. Specifically, the rising portion 63B includes a slope portion B1 and a slope portion B2. The slope portion B1 is inclined downward from the top portion T1 toward the connection terminal P1. The slope portion B2 is inclined downward from the top portion T1 in a direction away from the connection terminal P1. In the example shown in FIG. 25, the slope portion B1 is recessed and curved from the top portion T1 toward the connection terminal P1. The slope portion B2 is recessed and curved from the top portion T1 in the direction away from the connection terminal P1.

The rising portions 63B may be formed in the following manner. At first, the upper and side surfaces of the connection terminals P1 are roughened, for example, by wet etching of the exposed surfaces of the connection terminals P1 shown in FIGS. 10 and 11. Thereby, minute convex and concave portions are formed in the upper and side surfaces of the connection terminals P1. Then, the steps shown in FIGS. 12 to 14 are performed. The photosensitive resin layer 106 is, for example, formed by the spin coating method. In this case, because of steps defined by adjacent connection terminals P1 and a portion of the upper surface 53A of the insulating layer 53 between the adjacent connection terminals P1, a recess portion 106A is formed on an upper surface of the photosensitive resin layer 106 as shown in FIG. 26. Next, the photosensitive resin layer 106 is processed by the exposure and the excess development, Similarly to the above-described step in FIG. 14A, due to the differences in film thickness which arise during the formation of the photosensitive resin layer 106, differences in film thickness also arise in the photosensitive resin layer 106 after the excess development. Furthermore, during the excess development, immediately after the upper surfaces of the connection terminals P1 are exposed from the photosensitive resin layer 106, developer more dissolves minute portions of the photosensitive resin layer 106, which are disposed in the convex and concave portions of the side surfaces of the connection terminals P1, than the other portions of the photosensitive resin layer 106. Therefore, the developer penetrates into inside of the photosensitive resin layer 106 via an interface between the side surfaces of the connection terminals P1 and the photosensitive resin layer 106. As a result, the rising portions 63B (particularly, the slope portions B1) are formed.

The rising portion 63B (particularly the slope portion B1) thus configured can suitably suppress that the joining member 82 (see FIG. 3) which are solder plating or the like spreads outside the connection terminal P1. Also, the recessed and curved slope portion B2 can enhance the fluidity of the underfill resin 85.

The top portion Ti is not always formed into a needle-like shape. For example, the top portion T I may be formed into a shape having a flat surface.

The forming of the opening portions 61X in the exemplary embodiments and the modification examples may be omitted. In this case, the protection insulating layers 63 and the protection insulating layer 64 are, for example, formed continuously and integrally.

The protection insulating layers 64 in the exemplary embodiments and the modification examples may be omitted.

Plasma treatment may be carried out on the surface (the upper and side surfaces or only the upper surface) of the protection layer 60 in the exemplary embodiments and the modification examples. Thus, the wettability of the protection layer 60 can be improved.

In the exemplary embodiments, the upper end surface 32A of each via wiring 32 is formed to be flush with the upper surface 31A of the insulating layer 31. However, the invention is not limited thereto. The upper end surface 32A of each via wiring 32 may be formed to be recessed below the upper surface 31A of the insulating layer 31. Alternatively, the upper end surface of the via wiring 32 may be formed to protrude above the upper surface 31A of the insulating layer 31.

The sectional shapes of the through holes formed in the wiring substrates 10, 10A to 10C of the exemplary embodiments and the modification examples are not limited particularly. For example, the through holes in the wiring substrates 10, 10A to 10C may be formed into a straight shape (substantially rectangular shape in sectional view)

The number of wiring layers, the number of insulating layers, the layout of wirings, etc. in the wiring structures 11, 11A to 11C of the exemplary embodiments and the modification examples may be modified or changed variously.

The number of wiring layers, the number of insulating layers, the layout of wirings, etc. in the wiring structures 12, 12B of the exemplary embodiments and the modification examples may be modified or changed variously.

Electronic components other than semiconductor chips, for example, chip components such as chip capacitors, chip resistors or chip inductors, crystal vibrators, etc. may be mounted in place of semiconductor chips on the wiring boards 10 and 10A to 10C in the exemplary embodiments and the modification examples.

Also, the mounting form (for example, flip-flop mounting, wire-bonding mounting, solder mounting, or any combination of these forms) of electronic components including the semiconductor chips 80, chip components, crystal vibrators, etc, may be modified or changed variously.

In the exemplary embodiments, the upper and lower wiring layers on the core substrate 20 are electrically connected to each other through the through electrodes 21 which fill the through holes 20X or 20Y of the core substrate 20. However, the invention is not limited thereto. The upper and lower wiring layers on the core substrate 20 may be electrically connected to each other through a through-hole plating layer (through electrodes) provided in the inner wall of the through holes 20X, 20Y. In this case, holes of the through hole 20X 20Y which are formed on the inner side of the through hole plating layer may be filled with resin.

[Clauses]

This disclosure further encompasses various exemplary embodiments, for example, described below 1. A method for manufacturing a wiring board, the method comprising:

forming a first wiring layer, the first wiring layer comprising an upper surface, a lower surface that is opposite from the upper surface, and a side surface that connects the upper surface and the lower surface;

forming a first insulating layer made of first insulating resin which contains first photosensitive resin as a main component, the first insulating layer covering the first wiring layer:

forming first via wirings that passes through the first insulating layer in a thickness direction, and forming columnar connection terminals that are electrically connected to the first wiring layer through the first via wirings and that protrude upward from an upper surface of the first insulating layer; and forming a protection layer on the upper surface of the first insulating layer, the protection layer being made of second insulating resin which contains second photosensitive resin as a main component, wherein the forming the protection layer forms the protection layer to comprise a first protection layer and a second protection layer, the first protection layer is formed in a mounting region in which an electronic component to be connected to the connection terminals is to be formed, the second protection layer is formed in an outer peripheral region outside the mounting region, the second protection layer is separated from the first protection layer by a first opening portion which exposes the upper surface of the first insulating layer, and the second protection layer is thinner than the first protection layer.

2. The method of the clause 1, wherein the forming the protection layer comprises applying the varnish second insulating resin onto the upper surface of the first insulating layer so as to form a photosensitive resin layer covering the whole surfaces of the connection terminals, and patterning the photosensitive resin layer by exposure and development, and thinning the photosensitive resin layer to form the protection layer.

What is claimed is:

1. A wiring board comprising:
a first wiring layer comprising
an upper surface,
a lower surface that is opposite from the upper surface, and
a side surface that connects the upper surface and the lower surface;
a first insulating layer made of first insulating resin which contains first photosensitive resin as a main component, the first insulating layer covering the side surface of the first wiring layer and covering one part of the upper surface of the first wiring layer, the first insulating layer being formed with through holes, the through holes passing through the first insulating layers in a thickness direction, the through holes exposing the remaining part of the first wiring layer;
first via wirings formed in the through holes;
connection terminals that are electrically connected to the first wiring layer through the first via wirings, that protrude upward from an upper surface of the first insulating layer, and that are to be connected to an electronic component; and
a protection layer that is made of second insulating resin which contains second photosensitive resin as a main component and that is formed on the upper surface of the first insulating layer, wherein
the protection layer comprises
a first protection layer that is formed in a mounting region in which the electronic component is to be mounted, and that surrounds the connection terminals, and
a second protection layer that is formed in an outer peripheral region outside the mounting region, that is separated from the first protection layer by a first opening portion which exposes the upper surface of the first insulating layer, and that is thinner than the first protection layer.

2. The wiring board of claim 1, wherein the first protection layer is thinner than the connection terminals.

3. The wiring board of of claim 1, wherein:
the first protection layer comprises
first protection insulating layers that surround the connection terminals respectively and that is in contact with side surfaces of the connection terminals, and
second protection insulating layers that surround the connection terminals, respectively, that are formed between adjacent ones of the first protection insulating layers and that are separated from the first protection insulating layers,
second opening portions are formed between the first protection insulating layers and the second protection insulating layers and between the adjacent ones of the first protection insulating layers, the second opening portions expose the upper surface of the first insulating layer, and
the second opening portions surround the first protection insulating layers.

4. The wiring board of claim 3, wherein
curved portions are formed on upper surfaces of the first protection insulating layers,
the curved portions are concave toward a direction away from the connection terminals, and
the curved portions extend from the side surfaces of the connection terminals.

5. The wiring board of claim 3, wherein
rising portions are formed on upper surfaces of the first protection insulating layers so as to rise upward,
the rising portions are curved and recessed from top portions of the rising portions toward the connection terminals, and
the rising portions are curved and recessed from the top portions of the rising portions in a direction away from the connection terminals.

6. The wiring board of claim 1, wherein
each connection terminal further comprises an upper surface, and
the upper and side surfaces of the connection terminals are roughened surfaces.

7. The wiring board of claim 1, wherein
each connection terminal further comprises an upper surface, and
a surface roughness of the upper and side surfaces of the connection terminals is in a range of 0.2 μm to 1.0 μm.

8. The wiring board of claim 1, further comprising:
a first wiring structure comprising
a second wiring layer,
a second insulating layer that covers the second wiring layer, and
second via wirings that pass through the second insulating layer in the thickness direction and that are electrically connected to the second wiring layer, each second via wiring comprising an upper end surface exposed from the second insulating layer; and
a second wiring structure that is stacked on an upper surface of the second insulating layer and the upper end surfaces of the second via wirings, wherein
the second wiring structure comprises
the first wiring layer,
the first insulating layer,
the first via wirings,
the connection terminals, and
the protection layer,
the first wiring layer is electrically connected to the second via wirings, and
a wiring width and a wiring interval of the first wiring layer are smaller than those of the second wiring layer.

9. A semiconductor device comprising:
the wiring board of claim 1; and
a semiconductor chip that is mounted on the connection terminals in a flip-chip manner.

* * * * *